United States Patent
Jang et al.

(10) Patent No.: US 12,007,647 B2
(45) Date of Patent: Jun. 11, 2024

(54) COLOR CONVERSION PANEL WITH IMPROVED LIGHT EFFICIENCY AND DISPLAY DEVICE INCLUDING THE SAME

(71) Applicant: Samsung Display Co., Ltd., Yongin-si (KR)

(72) Inventors: Chang-Soon Jang, Seoul (KR); Byung-Chul Kim, Suwon-si (KR); In-Ok Kim, Osan-si (KR); Jae-Min Seong, Suwon-si (KR); In-Seok Song, Pocheon-si (KR); Gak-Seok Lee, Hwaseong-si (KR); Ji-Eun Jang, Suwon-si (KR); Sun-Kyu Joo, Suwon-si (KR); Ha-Lim Ji, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 390 days.

(21) Appl. No.: 17/310,306

(22) PCT Filed: Mar. 25, 2020

(86) PCT No.: PCT/KR2020/004061
§ 371 (c)(1),
(2) Date: Jul. 27, 2021

(87) PCT Pub. No.: WO2020/226281
PCT Pub. Date: Nov. 12, 2020

(65) Prior Publication Data
US 2022/0050330 A1    Feb. 17, 2022

(30) Foreign Application Priority Data
May 9, 2019   (KR) .................. 10-2019-0054449

(51) Int. Cl.
G02F 1/1335      (2006.01)
G02F 1/13357     (2006.01)
H10K 59/38       (2023.01)

(52) U.S. Cl.
CPC .. *G02F 1/133614* (2021.01); *G02F 1/133621* (2013.01); *H10K 59/38* (2023.02)

(58) Field of Classification Search
None
See application file for complete search history.

(56) References Cited

U.S. PATENT DOCUMENTS 10,090,335 B2    10/2018  Kang et al.
2008/0231162 A1   9/2008  Kurihara et al.
(Continued)

FOREIGN PATENT DOCUMENTS

KR    10-2001-0004314 A     1/2001
KR    10-2012-0097774 A     9/2012
(Continued)

OTHER PUBLICATIONS

International Search Report for corresponding Application No. PCT/KR2020/004061 dated Jul. 6, 2020, 4pp.
(Continued)

*Primary Examiner* — Nduka E Ojeh
(74) *Attorney, Agent, or Firm* — Lewis Roca Rothgerber Christie LLP

(57) ABSTRACT

A display device includes: a display panel; and a color conversion panel overlapping with the display panel. The color conversion panel includes: a substrate; a first color conversion pattern on the substrate; a second color conversion pattern on the substrate, and partially overlapping with the first color conversion pattern; a first reflective partition wall between the first color conversion pattern and the second color conversion pattern; a first color filter between (Continued)

the substrate and the first color conversion pattern; and a second color filter between the substrate and the second color conversion pattern.

25 Claims, 17 Drawing Sheets

(56) References Cited

U.S. PATENT DOCUMENTS

| | | | |
|---|---|---|---|
| 2017/0076678 A1 | 3/2017 | Lee et al. | |
| 2018/0015866 A1 | 1/2018 | Flaherty et al. | |
| 2018/0045866 A1* | 2/2018 | Chae | G02F 1/133553 |
| 2019/0025655 A1 | 1/2019 | Kim et al. | |
| 2019/0094624 A1* | 3/2019 | Kim | G02F 1/133617 |

FOREIGN PATENT DOCUMENTS

| | | |
|---|---|---|
| KR | 10-2017-0031613 A | 3/2017 |
| KR | 10-2018-0018945 A | 2/2018 |
| KR | 10-2019-0036577 A | 4/2019 |

OTHER PUBLICATIONS

European Office Action issued in corresponding EP Application No. 20 801 930.7, dated Dec. 18, 2023, 6 pages.

* cited by examiner

COLOR CONVERSION PANEL WITH IMPROVED LIGHT EFFICIENCY AND DISPLAY DEVICE INCLUDING THE SAME

CROSS-REFERENCE TO RELATED APPLICATIONS

This application is a U.S. National Phase Patent Application of International Patent Application Number PCT/KR2020/004061, filed on Mar. 25, 2020, which claims priority to Korean Patent Application Number 10-2019-0054449, filed on May 9, 2019, the entire content of all of which is incorporated by reference herein.

BACKGROUND

1. Field

Aspects of embodiments of the present disclosure relate to a display device. More particularly, aspects of embodiments of the present disclosure relate to a display device including a color conversion panel.

2. Description of the Related Art

With the development of information technology, the market for a display device, which is a connection medium between a user and information, is growing. Accordingly, the use of flat panel display devices, for example, such as an organic light emitting display device, a liquid crystal display device, and/or the like, is increasing.

Recently, a display device including a color conversion panel has been proposed to implement a display device having high light efficiency.

The above information disclosed in this Background section is for enhancement of understanding of the background of the present disclosure, and therefore, it may contain information that does not constitute prior art.

SUMMARY

One or more embodiments of the present disclosure are directed to a high resolution display device.

One or more embodiments of the the present disclosure are directed to a color conversion panel with improved light efficiency.

According to one or more embodiments of the present disclosure, a display device includes: a display panel; and a color conversion panel overlapping with the display panel. The color conversion panel includes: a substrate; a first color conversion pattern on the substrate; a second color conversion pattern on the substrate, and partially overlapping with the first color conversion pattern; a first reflective partition wall between the first color conversion pattern and the second color conversion pattern; a first color filter between the substrate and the first color conversion pattern; and a second color filter between the substrate and the second color conversion pattern.

In an embodiment, the first reflective partition wall may cover a side of the first color conversion pattern.

In an embodiment, the second color conversion pattern may not contact the first color conversion pattern.

In an embodiment, the second color conversion pattern may contact the first color conversion pattern underneath the first reflective partition wall.

In an embodiment, the color conversion panel may further include: a light blocking pattern partially overlapping with the first color conversion pattern and the second color conversion pattern between the first color conversion pattern and the second color conversion pattern.

In an embodiment, the light blocking pattern may be located between the substrate and the first color conversion pattern, and between the substrate and the second color conversion pattern.

In an embodiment, the light blocking pattern may be located on the first color conversion pattern and the second color conversion pattern.

In an embodiment, a width of the light blocking pattern may be greater than a width of an area in which the first color conversion pattern overlaps with the second color conversion pattern.

In an embodiment, the color conversion panel may further include: a transmission pattern on the substrate, and partially overlapping with a portion of the first color conversion pattern that is adjacent thereto and the second color conversion pattern.

In an embodiment, the color conversion panel may further include: a second reflective partition wall between the portion of the first color conversion pattern and the transmission pattern, and between the second color conversion pattern and the transmission pattern.

In an embodiment, the second reflective partition wall may cover a side of the transmission pattern.

In an embodiment, the transmission pattern may not contact the portion of the first color conversion pattern and the second color conversion pattern.

In an embodiment, the transmission pattern may contact the portion of the first color conversion pattern and the second color conversion pattern underneath the second reflective partition wall.

In an embodiment, the display panel may be configured to emit a first color light to the color conversion panel, the first color conversion pattern may be configured to convert the first color light into a second color light, the second color conversion pattern may be configured to convert the first color light into a third color light, and the transmission pattern may be configured to transmit the first color light.

In an embodiment, each of the first color conversion pattern and the second color conversion pattern may include at least one of a quantum dot and a phosphor.

According to one or more embodiments of the present disclosure, a color conversion panel includes: a substrate; a first color conversion pattern on the substrate, and configured to convert an incident light into a first color light; a second color conversion pattern on the substrate, and configured to convert the incident light into a second color light, the second color conversion pattern partially overlapping with the first color conversion pattern; a first reflective partition wall between the first color conversion pattern and the second color conversion pattern; a first color filter between the substrate and the first color conversion pattern, and configured to block the incident light that is not converted by the first color conversion pattern; and a second color filter between the substrate and the second color conversion pattern, and configured to block the incident light that is not converted by the second color conversion pattern.

In an embodiment, the color conversion panel may further include: a transmission pattern on the substrate, and configured to transmit the incident light, the transmission pattern partially overlapping with a portion of the first color conversion pattern that is adjacent thereto.

In an embodiment, the color conversion panel may further include: a second reflective partition wall between the portion of the first color conversion pattern and the transmission pattern.

In an embodiment, the color conversion panel may further include: a light blocking pattern partially overlapping with the first color conversion pattern and the second color conversion pattern between the first color conversion pattern and the second color conversion pattern, and partially overlapping with the portion of the first color conversion pattern and the transmission pattern between the portion of the first color conversion pattern and the transmission pattern.

In an embodiment, the light blocking pattern may be located between the substrate and the first color conversion pattern, between the substrate and the second color conversion pattern, and between the substrate and the transmission pattern.

In an embodiment, the light blocking pattern may be located on the first color conversion pattern, the second color conversion pattern, and the transmission pattern.

According to one or more embodiments of the present disclosure, a color conversion panel, includes: a substrate; a first color conversion pattern on the substrate, and configured to convert an incident light into a first color light; a second color conversion pattern on the substrate, and configured to convert the incident light into a second color light, the second color conversion pattern being spaced apart from the first color conversion pattern; a first reflective partition wall covering a side of the first color conversion pattern; a second reflective partition wall covering a side of the second color conversion pattern; a first color filter between the substrate and the first color conversion pattern, and configured to block the incident light that is not converted by the first color conversion pattern; and a second color filter between the substrate and the second color conversion pattern, and configured to block the incident light that is not converted by the second color conversion pattern.

In an embodiment, the color conversion panel may further include: a transmission pattern on the substrate, and configured to transmit the incident light, the transmission pattern being spaced apart from the first color conversion pattern and the second color conversion pattern.

In an embodiment, the color conversion panel may further include: a third reflective partition wall covering a side of the transmission pattern.

In an embodiment, the color conversion panel may further include: a light blocking pattern partially overlapping with the first color conversion pattern and the second color conversion pattern between the first color conversion pattern and the second color conversion pattern, partially overlapping with a portion of the first color conversion pattern that is adjacent to the transmission pattern and the transmission pattern between the portion of the first color conversion pattern and the transmission pattern, and partially overlapping with the second color conversion pattern and the transmission pattern between the second color conversion pattern and the transmission pattern.

In an embodiment, the light blocking pattern may cover the first reflective partition wall, the second reflective partition wall, and the third reflective partition wall.

In an embodiment, the second reflective partition wall may be spaced apart from the first reflective partition wall.

In the color conversion panel of the display device according to one or more embodiments of the present disclosure, the color conversion patterns may partially overlap with one another, and the reflective partition wall may be disposed between the partially overlapping color conversion patterns, so that a high resolution display device in which color conversion efficiency, light efficiency, and/or the like are improved may be provided.

In the color conversion panel according to one or more embodiments of the present disclosure, the color conversion patterns may partially overlap with one another, and the reflective partition wall may be disposed between the partially overlapping color conversion patterns, so that color conversion efficiency, light efficiency, and/or the like of the color conversion panel may be improved, and color mixture and/or the like may be prevented or reduced.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
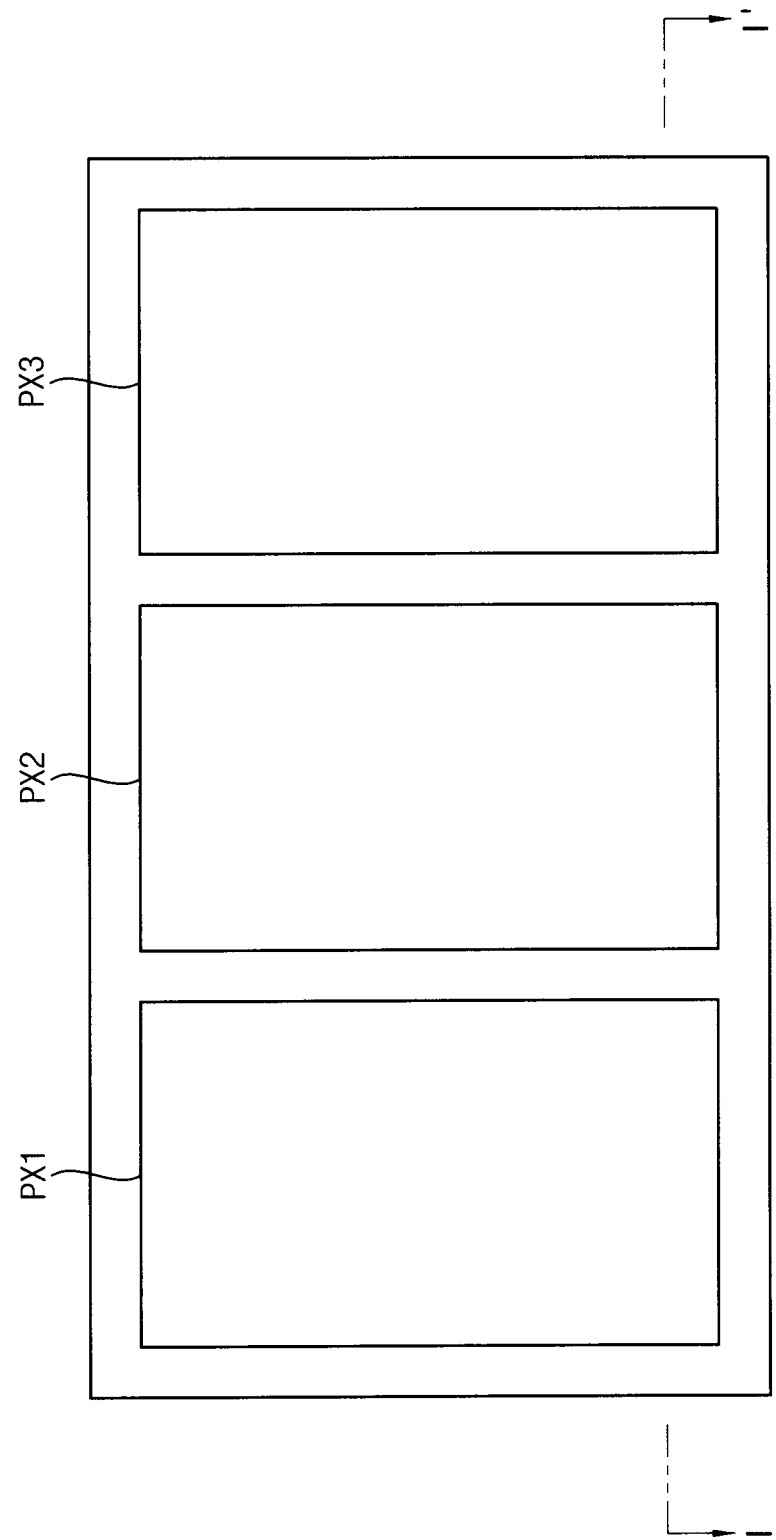
FIG. 1 is a plan view illustrating a display device according to an embodiment.

Hereinafter, embodiments of display devices and color conversion panels will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

FIG. 1 is a plan view illustrating a display device according to an embodiment.

Referring to FIG. 1, a plurality of pixels arranged in matrix form or substantially in matrix form in a plan view (e.g., a view from a direction that is perpendicular to or substantially perpendicular to the relevant element or layer) may be defined in a display device according to an embodiment. The term 'pixel' as used herein refers to a single area defined by partitioning a display area in a plan view for a color display, and one pixel may display one color (e.g., one predetermined basic color). In other words, one pixel may be a minimum unit capable of displaying a color independent from the other pixels.

The pixels may include a first pixel PX1 for displaying a first color, a second pixel PX2 for displaying a second color having a peak wavelength shorter than that of the first color, and a third pixel PX3 for displaying a third color having a peak wavelength shorter than that of the second color. In an embodiment, the first pixel PX1, the second pixel PX2, and the third pixel PX3, which are sequentially arranged in a direction (e.g., in one direction), may form a basic unit, and may be repeatedly arranged in the direction (e.g., the one direction).

In an embodiment, the first pixel PX1 may be a pixel that displays the first color (e.g., a red color) having a peak wavelength within a range of about 610 nm to about 650 nm, the second pixel PX2 may be a pixel that displays the second color (e.g., a green color) having a peak wavelength within a range of about 530 nm to 570 nm, and the third pixel PX3 may be a pixel that displays the third color (e.g., a blue color) having a peak wavelength within a range of about 430 nm to about 470 nm.

Figure 2:
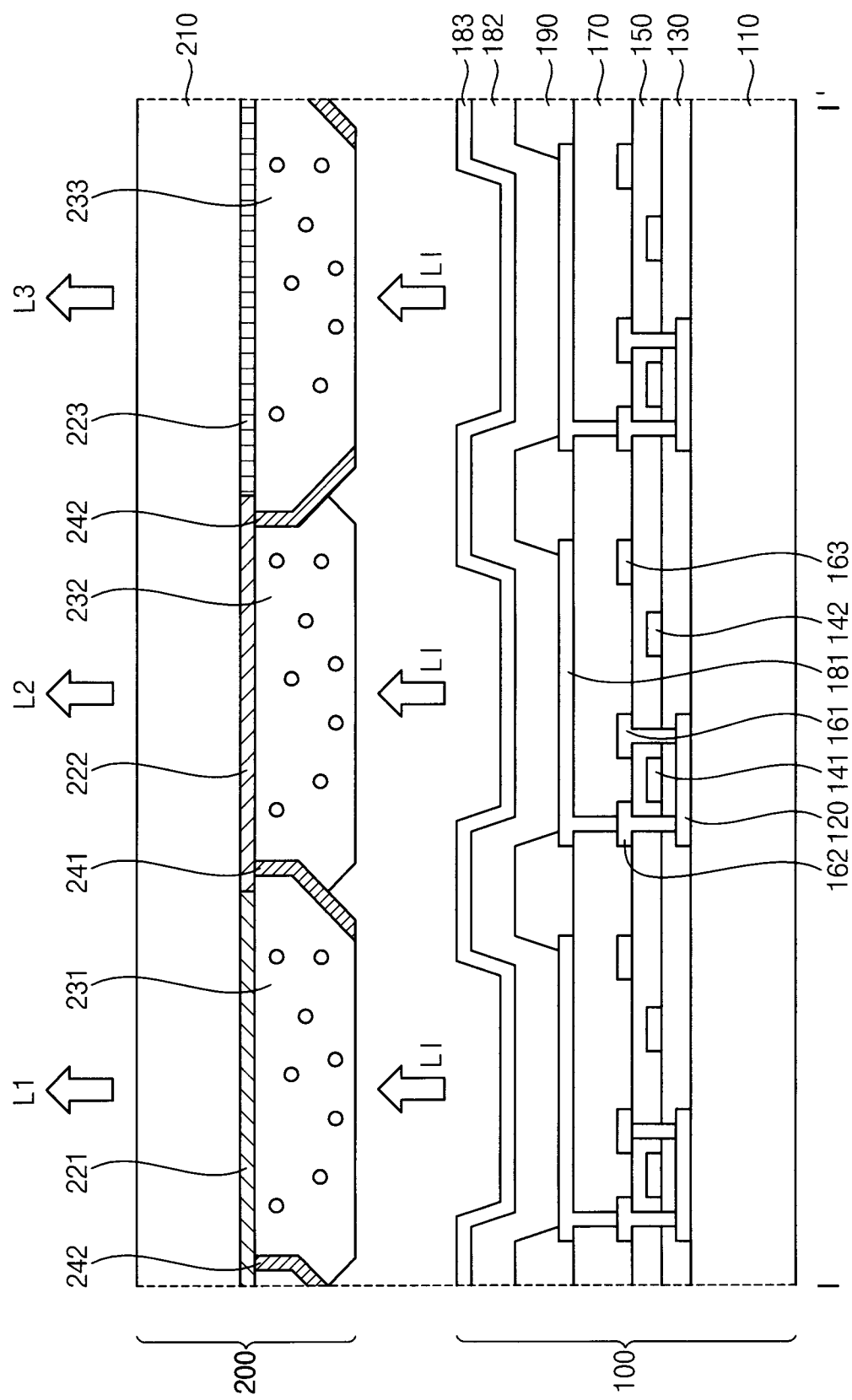
FIG. 2 is a cross-sectional view illustrating an example of the display device taken along the line I-I' in FIG. 1.

FIG. 2 is a cross-sectional view illustrating an example of the display device taken along the line I-I' in FIG. 1.

Referring to FIGS. 1 and 2, the display device according to an embodiment may include a display panel 100 and a color conversion panel 200. The display panel 100 may include a base substrate 110, a semiconductor layer 120, a gate insulation layer 130, a gate electrode 141, a gate line 142, an insulation interlayer 150, a source electrode 161, a drain electrode 162, a data line 163, a planarization layer 170, a first electrode 181, a pixel defining layer 190, an emission layer 182, and a second electrode 183. The display panel 100 may provide incident light LI to the color conversion panel 200.

The semiconductor layer 120 may be disposed on the base substrate 110. The semiconductor layer 120 may include amorphous silicon, polycrystalline silicon, oxide semiconductor, or the like. The gate insulation layer 130 may be disposed on the semiconductor layer 120. The gate insulation layer 130 may include silicon nitride, silicon oxide, or the like.

The gate electrode 141 and the gate line 142 may each include a conductive material, and may be disposed on the gate insulation layer 130. The gate electrode 141 may overlap with the semiconductor layer 120. The gate line 142 may transmit a gate signal, and may extend along one direction. The insulation interlayer 150 may be disposed on the gate electrode 141 and the gate line 142. The insulation interlayer 150 may include silicon nitride, silicon oxide, or the like.

The source electrode 161, the drain electrode 162, and the data line 163 may each include a conductive material, and may be disposed on the insulation interlayer 150. The source electrode 161 and the drain electrode 162 may be connected to the semiconductor layer 120. The data line 163 may transmit a data signal, and may extend along a direction crossing the gate line 142. The semiconductor layer 120, the gate electrode 141, the source electrode 161, and the drain electrode 162 may form a thin film transistor. The planarization layer 170 may be disposed on the source electrode 161, the drain electrode 162, and the data line 163. The planarization layer 170 may include an inorganic insulation material, for example, such as silicon nitride or silicon oxide, and/or an organic insulating material, for example, such as polyimide.

The first electrode 181 may include a conductive material, and may be disposed on the planarization layer 170. The first electrode 181 may be connected to the source electrode 161 or the drain electrode 162. The pixel defining layer 190 may be disposed on the planarization layer 170. The pixel defining layer 190 may include an opening that exposes a portion of the first electrode 181.

The emission layer 182 may be disposed on the first electrode 181. The emission layer 182 may include a suitable material that emits light of the third color. The second electrode 183 may include a conductive material, and may be disposed on the emission layer 182. The emission layer 182 may emit the incident light LI of the third color to above the display panel 100 (or a direction toward the color conversion panel 200) based on an electric field formed between the first electrode 181 and the second electrode 183. In an embodiment, the emission layer 182 may be formed on the first electrode 181 and the pixel defining layer 190, but the present disclosure is not limited thereto. In another embodiment, the emission layer 182 may be formed in the opening of the pixel defining layer 190 on the first electrode 181.

The color conversion panel 200 may overlap with the display panel 100. The color conversion panel 200 may be positioned above the display panel 100. The color conversion panel 200 may include a substrate 210, a first color filter 221, a second color filter 222, a third color filter 223, a first color conversion pattern 231, a second color conversion pattern 232, a transmission pattern 233, a first reflective partition wall 241, and a second reflective partition wall 242. The color conversion panel 200 may receive the incident light LI from the display panel 100, and may emit first light L1, second light L2, and third light L3 upward (or in a direction away from the display panel 100).

Figure 3:
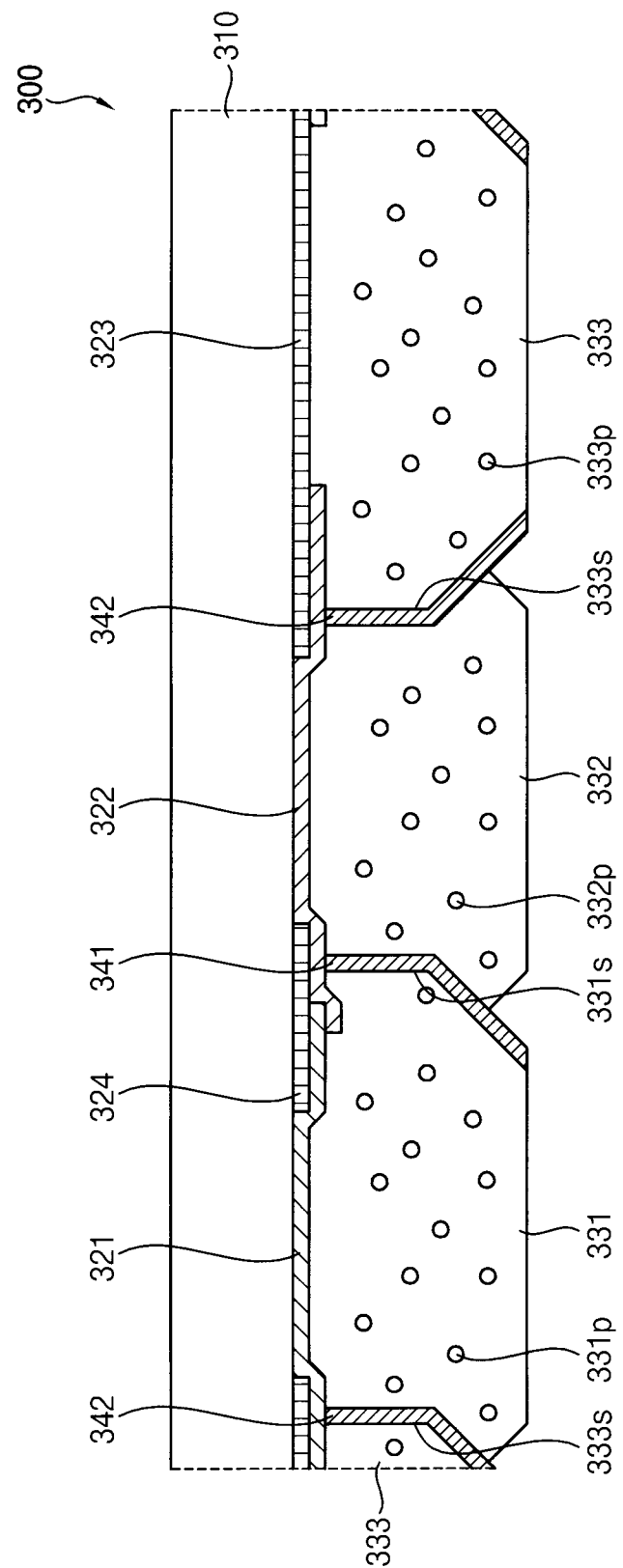
FIG. 3 is a cross-sectional view illustrating a color conversion panel according to an embodiment.

FIG. 3 is a cross-sectional view illustrating a color conversion panel according to an embodiment. For example, the color conversion panel 300 of FIG. 3 may illustrate an example of the color conversion panel 200 in FIG. 2.

Referring to FIGS. 1, 2, and 3, the color conversion panel 300 according to an embodiment may include a substrate 310, a first color filter 321, a second color filter 322, a third color filter 323, a first light blocking pattern 324, a first color conversion pattern 331, a second color conversion pattern 332, a transmission pattern 333, a first reflective partition wall 341, and a second reflective partition wall 342.

The substrate 310 may be a transparent insulating substrate. For example, the substrate 310 may be formed of glass, quartz, translucent plastic, or the like. In an embodiment, the substrate 310 may be a flexible substrate.

The first color filter 321 may be disposed on the substrate 310. The first color filter 321 may be a wavelength-selective optical filter that transmits light of a desired or suitable wavelength band (e.g., a predetermined or specific wavelength band), and blocks light of another wavelength band (e.g., another predetermined or specific wavelength band). In other words, the first color filter 321 may selectively transmit only a partial wavelength band of light incident thereon. For example, the first color filter 321 may include a pigment or dye that absorbs light of a predetermined or specific wavelength band.

In an embodiment, the first color filter 321 may selectively transmit light having a peak wavelength that is longer than the peak wavelength of the incident light LI provided by the display panel 100, and may block the incident light LI. For example, the first color filter 321 may be disposed at (e.g., in or on) the first pixel PX1 in a plan view, may transmit a first light L1 including the peak wavelength of the first color converted by the first color conversion pattern 331, and may absorb or reflect the incident light LI including the peak wavelength of the third color that is not converted by the first color conversion pattern 331.

The second color filter 322 may be disposed on the substrate 310. In an embodiment, the second color filter 322 may partially overlap with the first color filter 321. For example, the second color filter 322 may be disposed on the substrate 310 while covering a portion of the first color filter 321. The second color filter 322 may be a wavelength-selective optical filter that transmits light of a desired or suitable wavelength band (e.g., a predetermined or specific wavelength band), and blocks light of another wavelength band (e.g., another predetermined or specific wavelength band). In other words, the second color filter 322 may selectively transmit only a partial wavelength band of light incident thereon. For example, the second color filter 322 may include a pigment or dye that absorbs light of a predetermined or specific wavelength band.

In an embodiment, the second color filter 322 may selectively transmit light having a peak wavelength that is longer than the peak wavelength of the incident light LI provided by the display panel 100, and may block the incident light LI. For example, the second color filter 322 may be disposed at (e.g., in or on) the second pixel PX2 in a plan view, may transmit a second light L2 including the peak wavelength of the second color converted by the second color conversion pattern 332, and may absorb or reflect the incident light LI including the peak wavelength of the third color that is not converted by the second color conversion pattern 332.

The third color filter 323 may be disposed on the substrate 310. In an embodiment, the third color filter 323 may partially overlap with the first color filter 321 (e.g., an adjacent first color filter 321) and the second color filter 322. The third color filter 323 may be disposed between the first color filter 321 (e.g., the adjacent first color filter 321) and the second color filter 322, which are spaced apart from each other. For example, the first color filter 321 (e.g., the adjacent first color filter 321) may be disposed on the substrate 310 while covering a portion of the third color filter 323, and the second color filter 322 may be disposed on the substrate 310 while covering another portion of the third color filter 323. The third color filter 323 may be a wavelength-selective optical filter that transmits light of a desired or suitable wavelength band (e.g., a predetermined or specific wavelength band), and blocks light of another wavelength band (e.g., another predetermined or specific wavelength band). In other words, the third color filter 323 may selectively transmit only a partial wavelength band of light incident thereon. For example, the third color filter 323 may include a pigment or dye that absorbs light of a predetermined or specific wavelength band.

In an embodiment, the third color filter 323 may selectively transmit the incident light LI provided by the display panel 100. For example, the third color filter 323 may be disposed at (e.g., in or on) the third pixel PX3 in a plan view, and may transmit a third light L3 including the peak wavelength of the third color corresponding to the incident light LI transmitted by the transmission pattern 333.

The first light blocking pattern 324 may be disposed on the substrate 310. In an embodiment, the first light blocking pattern 324 may partially overlap with the first color filter 321 and the second color filter 322. The first light blocking pattern 324 may be disposed between the first color filter 321 and the second color filter 322 that partially overlap with each other. For example, the first color filter 321 may be disposed on the substrate 310 while covering a portion of the first light blocking pattern 324, and the second color filter 322 may be disposed on the substrate 310 while covering another portion of the first light blocking pattern 324. The first light blocking pattern 324 may be a wavelength-selective optical filter that transmits light of a desired or suitable wavelength band (e.g., a predetermined or specific wavelength band), and blocks light of another wavelength band (e.g., another predetermined or specific wavelength band). In other words, the first light blocking pattern 324 may selectively transmit only a partial wavelength band of light incident thereon. For example, the first light blocking pattern 324 may include the same or substantially the same material as that of the third color filter 323.

The first color conversion pattern 331 may be disposed on the substrate 310 with the first color filter 321 interposed therebetween. In other words, the first color filter 321 may be disposed between the substrate 310 and the first color conversion pattern 331. The first color conversion pattern 331 may convert incident light into transmitted light having a color different from a color of the incident light. In other words, the light transmitted through the first color conversion pattern 331 may be converted into light of a desired or suitable wavelength band (e.g., a predetermined or specific wavelength band). The first color conversion pattern 331 may include a first color conversion material 331*p*, which may be a material that converts a peak wavelength of the incident light into a desired or suitable peak wavelength (e.g., a predetermined or specific peak wavelength).

In an embodiment, the first color conversion pattern 331 may convert a color of the incident light LI provided by the display panel 100. For example, the first color conversion pattern 331 may convert the incident light LI including the peak wavelength of the third color into the first light L1 including the peak wavelength of the first color. The incident light LI provided by the display panel 100 may be converted into the first light L1 by the first color conversion pattern 331, and the first light L1 may be emitted to above the color conversion panel 300 through the first color filter 321. Accordingly, the first pixel PX1 may display the first color.

The second color conversion pattern 332 may be disposed on the substrate 310 with the second color filter 322 interposed therebetween. In other words, the second color filter 322 may be disposed between the substrate 310 and the second color conversion pattern 332. The second color conversion pattern 332 may convert incident light into transmitted light having a color different from a color of the incident light. In other words, the light transmitted through the second color conversion pattern 332 may be converted into light of a desired or suitable wavelength band (e.g., a predetermined or specific wavelength band). The second color conversion pattern 332 may include a second color conversion material 332*p*, which may be a material that converts a peak wavelength of the incident light into a desired or suitable peak wavelength (e.g., a predetermined or specific peak wavelength).

In an embodiment, the second color conversion pattern 332 may convert a color of the incident light LI provided by the display panel 100. For example, the second color conversion pattern 332 may convert the incident light LI including the peak wavelength of the third color into the second light L2 including the peak wavelength of the second color. The incident light LI provided by the display panel 100 may be converted into the second light L2 by the second color conversion pattern 332, and the second light L2 may be emitted to above the color conversion panel 300 through the second color filter 322. Accordingly, the second pixel PX2 may display the second color.

In an embodiment, a height of the second color conversion pattern 332 from the substrate 310 may be equal to or substantially equal to a height of the first color conversion pattern 331 from the substrate 310. The height of the first color conversion pattern 331 may be a distance from the substrate 310 to a lower surface of the first color conversion pattern 331, and the height of the second color conversion pattern 332 may be a distance from the substrate 310 to a lower surface of the second color conversion pattern 332.

The first color conversion material 331p may be a material that emits light having a peak wavelength of the first color. The size of the first color conversion material 331p may be about 55 Å to about 65 Å, but the size of the first color conversion material 331p is not limited thereto. The second color conversion material 332p may be a material that emits light having a peak wavelength of the second color. The size of the second color conversion material 332p may be about 40 Å to about 50 Å, but the size of the second color conversion material 332p is not limited thereto.

In an embodiment, each of the first color conversion pattern 331 and the second color conversion pattern 332 may include at least one of a quantum dot and a phosphor. In other words, each of the first color conversion material 331p and the second color conversion material 332p may be at least one of the quantum dot and the phosphor.

The quantum dot may emit a specific color when electrons transit from a conduction band to a valence band. The quantum dot may have a core-shell structure. The core may include (e.g., may be (a semiconductor nanocrystalline material. For example, the core may include silicon-based nanocrystals, II-VI-based compound nanocrystals, III-V-based compound nanocrystals, or the like, but the material of the core is not limited thereto. For example, the quantum dot may include a core including (e.g., containing) cadmium selenide (CdSe), cadmium telluride (CdTe), cadmium sulfide (CdS), or indium phosphide (InP), and a shell including (e.g., containing) zinc sulfide (ZnS).

The second color conversion pattern 332 may partially overlap with the first color conversion pattern 331. A portion of the second color conversion pattern 332 may overlap with a portion of the first color conversion pattern 331. For example, the portion of the second color conversion pattern 332 may be positioned under (e.g., underneath) the portion of the first color conversion pattern 331. When the first color conversion pattern 331 and the second color conversion pattern 332 partially overlap with each other, the volume of the first color conversion pattern 331 and the volume of the second color conversion pattern 332 may be increased. Accordingly, color conversion efficiency of the first color conversion pattern 331 and color conversion efficiency of the second color conversion pattern 332 may be increased.

The transmission pattern 333 may be disposed on the substrate 310 with the third color filter 323 interposed therebetween. In other words, the third color filter 323 may be disposed between the substrate 310 and the transmission pattern 333. The transmission pattern 333 may transmit incident light while maintaining or substantially maintaining the color of the incident light. In other words, the light transmitted through the transmission pattern 333 may not be converted. The transmission pattern 333 may include a transmissive material 333p.

In an embodiment, the transmission pattern 333 may transmit the incident light LI provided by the display panel 100. For example, the transmission pattern 333 may transmit the incident light LI including the peak wavelength of the third color, and may emit the third light L3 including the peak wavelength of the third color. The incident light LI provided by the display panel 100 may be transmitted through the transmission pattern 333, and the third light L3 corresponding to the incident light LI may be emitted to above the color conversion panel 300 through the third color filter 323. Accordingly, the third pixel PX3 may display the third color.

In an embodiment, a height of the transmission pattern 333 from the substrate 310 may be equal to or substantially equal to the height of the first color conversion pattern 331 from the substrate 310 and the height of the second color conversion pattern 332 from the substrate 310. The height of the transmission pattern 333 may be a distance from the substrate 310 to a lower surface of the transmission pattern 333.

The transmissive material 333p may be a light scattering material that induces scattering of the light passing through the transmission pattern 333. A material used as the transmissive material 333p is not particularly limited, as long as the material is capable of scattering or reflecting light, and may include (e.g., may be), for example, a metal oxide, an organic material, or the like. For example, the metal oxide may include titanium oxide, zirconium oxide, aluminum oxide, indium oxide, zinc oxide, tin oxide, or the like, and the organic material may include acrylic resin, urethane resin, or the like.

The transmission pattern 333 may partially overlap with the first color conversion pattern 331 (e.g., an adjacent first color conversion pattern 331) and the second color conversion pattern 332. A portion of the transmission pattern 333 may overlap with a portion of the first color conversion pattern 331 (e.g., the adjacent first color conversion pattern 331), and another portion of the transmission pattern 333 may overlap with a portion of the second color conversion pattern 332. For example, the portion of the first color conversion pattern 331 (e.g., the adjacent first color conversion pattern 331) may be positioned under (e.g., underneath) the portion of the transmission pattern 333, and the portion of the second color conversion pattern 332 may be positioned under (e.g., underneath) the another portion of the transmission pattern 333. When the transmission pattern 333 partially overlaps with the first color conversion pattern 331 and the second color conversion pattern 332, the volume of the first color conversion pattern 331, the volume of the second color conversion pattern 332, and the volume of the transmission pattern 333 may be increased. Accordingly, color conversion efficiency of the first color conversion pattern 331 and color conversion efficiency of the second color conversion pattern 332 may be increased.

The first reflective partition wall 341 may be disposed between the first color conversion pattern 331 and the second color conversion pattern 332. For example, the first reflective partition wall 341 may be disposed on the second color filter 322 between the first color conversion pattern 331 and the second color conversion pattern 332 that are adjacent to each other. The first reflective partition wall 341 may reflect light emitted to a side 331s of the first color conversion pattern 331 and a side of the second color conversion pattern 332 to emit the light toward the substrate 310. As the first reflective partition wall 341 is disposed between the first color conversion pattern 331 and the second color conversion pattern 332 that partially overlap with each other, color mixture defects due to the partial overlap between the first color conversion pattern 331 and the second color conversion pattern 332 may be prevented or substantially prevented.

The first reflective partition wall 341 may cover the side 331s of the first color conversion pattern 331. The first reflective partition wall 341 may entirely cover the side 331s of the first color conversion pattern 331 positioned between the first color conversion pattern 331 and the second color conversion pattern 332. The first reflective partition wall 341 may be formed along a profile of the side 331s of the first color conversion pattern 331 positioned between the first color conversion pattern 331 and the second color conversion pattern 332. A height of the first reflective partition wall 341 from the substrate 310 may be equal to or substantially equal to the height of the first color conversion pattern 331 from the substrate 310. The height of the first reflective partition wall 341 may be a distance from the substrate 310 to a lower surface of the first reflective partition wall 341. As the first reflective partition wall 341 entirely covers the side 331s of the first color conversion pattern 331, the second color conversion pattern 332 may not contact the first color conversion pattern 331. Accordingly, light emission efficiency of the first color conversion pattern 331 and the second color conversion pattern 332 may be increased.

The second reflective partition wall 342 may be disposed between the first color conversion pattern 331 (e.g., the adjacent first color conversion pattern 331) and the transmission pattern 333, and between the second color conversion pattern 332 and the transmission pattern 333. For example, the second reflective partition wall 342 may be disposed on the first color filter 321 (e.g., the adjacent first color filter 321) between the first color conversion pattern 331 (e.g., the adjacent first color conversion pattern 331) and the transmission pattern 333 that are adjacent to each other, and on the second color filter 322 between the second color conversion pattern 332 and the transmission pattern 333 that are adjacent to each other. The second reflective partition wall 342 may reflect light emitted to the side 331s of the first color conversion pattern 331, a side of the second color conversion pattern 332, and a side 333s of the transmission pattern 333 to emit the light toward the substrate 310. As the second reflective partition wall 342 is disposed between the first color conversion pattern 331 (e.g., the adjacent first color conversion pattern 331) and the transmission pattern 333 that partially overlap with each other and between the second color conversion pattern 332 and the transmission pattern 333 that partially overlap with each other, color mixture defects due to the partial overlap between the first color conversion pattern 331 (e.g., the adjacent first color conversion pattern 331) and the transmission pattern 333 and color mixture defects due to the partial overlap between the second color conversion pattern 332 and the transmission pattern 333 may be prevented or substantially prevented.

The second reflective partition wall 342 may cover the side 333s of the transmission pattern 333. The second reflective partition wall 342 may entirely cover the side 333s of the transmission pattern 333 positioned between the transmission pattern 333 and the first color conversion pattern 331 (e.g., the adjacent first color conversion pattern 331) and between the transmission pattern 333 and the second color conversion pattern 332. The second reflective partition wall 342 may be formed along a profile of the side 333s of the transmission pattern 333 positioned between the transmission pattern 333 and the first color conversion pattern 331 (e.g., the adjacent first color conversion pattern 331) and between the transmission pattern 333 and the second color conversion pattern 332. A height of the second reflective partition wall 342 from the substrate 310 may be equal to or substantially equal to the height of the transmission pattern 333 from the substrate 310. The height of the second reflective partition wall 342 may be a distance from the substrate 310 to a lower surface of the second reflective partition wall 342. As the second reflective partition wall 342 entirely covers the side 333s of the transmission pattern 333, the transmission pattern 333 may not contact the first color conversion pattern 331 (e.g., the adjacent first color conversion pattern 331) and the second color conversion pattern 332. Accordingly, light emission efficiency of the first color conversion pattern 331, the second color conversion pattern 332, and the transmission pattern 333 may be increased.

The first reflective partition wall 341 and the second reflective partition wall 342 may include a material capable of reflecting light, for example, such as a material having a reflectance of about 50% or more. In an embodiment, the first reflective partition wall 341 and the second reflective partition wall 342 may have a single-layer structure including aluminum (Al) or the like, or a multilayered structure including indium tin oxide (ITO)-silver (Ag)-ITO, titanium (Ti)—Al—Ti, Al-manganese tin oxide (MTO), or the like, but the materials of the first and second reflective partition walls 341 and 342 are not limited thereto. In an embodiment, the first reflective partition wall 341 and the second reflective partition wall 342 may include the same or substantially the same material.

As the first color conversion pattern 331 and the second color conversion pattern 332 of the color conversion panel 300 of the display device according to the present embodiment partially overlaps with each other, color conversion efficiency of the color conversion panel 300 may be improved. Further, as the first reflective partition wall 341 is disposed between the first color conversion pattern 331 and the second color conversion pattern 332, which partially overlap with each other, color mixture of the color conversion panel 300 may be prevented or reduced. Accordingly, a high-resolution display device may be provided in which color conversion efficiency is improved, and color mixture is prevented or reduced.

Figure 4:
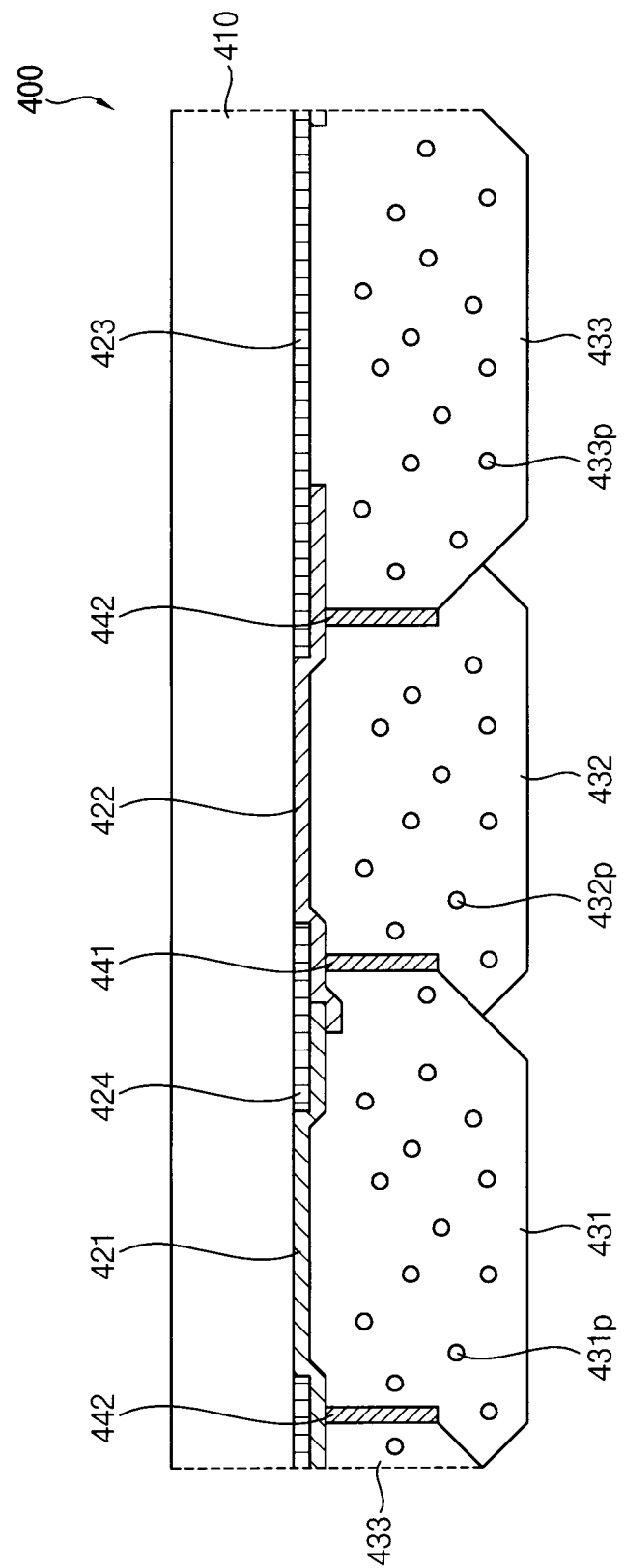
FIG. 4 is a cross-sectional view illustrating a color conversion panel according to an embodiment.

FIG. 4 is a cross-sectional view illustrating a color conversion panel according to an embodiment.

Referring to FIG. 4, a color conversion panel 400 according to an embodiment may include a substrate 410, a first color filter 421, a second color filter 422, a third color filter 423, a first light blocking pattern 424, a first color conversion pattern 431, a second color conversion pattern 432, a transmission pattern 433, a first reflective partition wall 441, and a second reflective partition wall 442. Redundant description of the components of the color conversion panel 400 shown in FIG. 4 that are the same or substantially the same as (or similar to) those of the color conversion panel 300 described above with reference to FIG. 3 may not be repeated.

A height of the first reflective partition wall 441 from the substrate 410 may be less than a height of the first color conversion pattern 431 from the substrate 410. The first reflective partition wall 441 may cover a portion of a side of the first color conversion pattern 431 that is adjacent to (e.g., that is close to) the substrate 410, and may not cover another portion of the side of the first color conversion pattern 431 farther from the substrate 410. Accordingly, the second color conversion pattern 432 may contact the first color conversion pattern 431 under (e.g., underneath) the first reflective partition wall 441. The second color conversion pattern 432 may cover the first reflective partition wall 441, and the first reflective partition wall 441 may not be exposed to the outside by the second color conversion pattern 432. Accordingly, reflection of incident light by the first reflective partition wall 441 that is exposed to the outside may be prevented or reduced.

A height of the second reflective partition wall 442 from the substrate 410 may be less than a height of the transmission pattern 433 from the substrate 410. The second reflective partition wall 442 may cover a portion of a side of the transmission pattern 433 that is adjacent to (e.g., that is close to) the substrate 410, and may not cover another portion of the side of the transmission pattern 433 farther from the substrate 410. Accordingly, the first color conversion pattern 431 (e.g., the adjacent first color conversion pattern 431) and the second color conversion pattern 432 may contact the transmission pattern 433 under (e.g., underneath) the second reflective partition wall 442. The first color conversion pattern 431 (e.g., the adjacent first color conversion pattern 431) and the second color conversion pattern 432 may cover the second reflective partition wall 442, and the second reflective partition wall 442 may not be exposed to the outside by the first color conversion pattern 431 (e.g., the adjacent first color conversion pattern 431) and the second color conversion pattern 432. Accordingly, reflection of incident light by the second reflective partition wall 442 that is exposed to the outside may be prevented or reduced.

Figure 5:
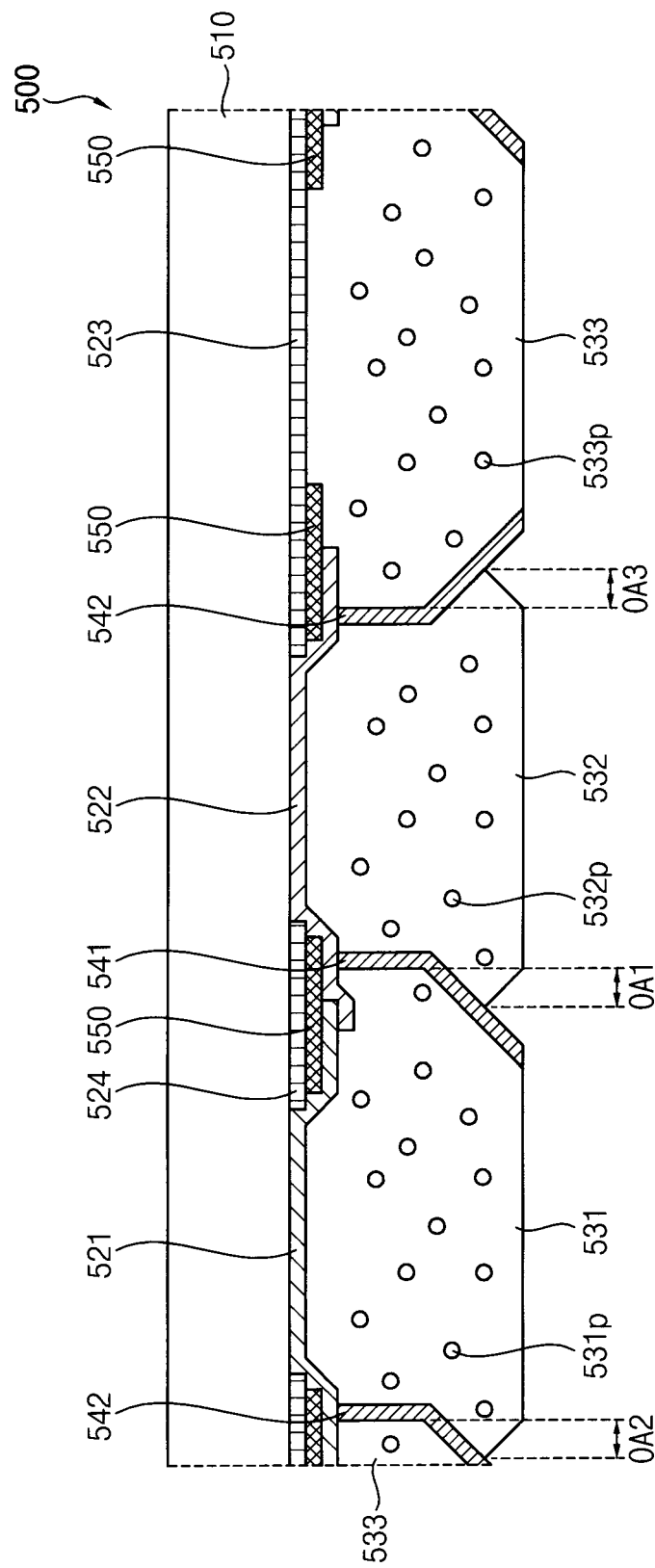
FIG. 5 is a cross-sectional view illustrating a color conversion panel according to an embodiment.

FIG. 5 is a cross-sectional view illustrating a color conversion panel according to an embodiment.

Referring to FIG. 5, a color conversion panel 500 according to an embodiment may include a substrate 510, a first color filter 521, a second color filter 522, a third color filter 523, a first light blocking pattern 524, a first color conversion pattern 531, a second color conversion pattern 532, a transmission pattern 533, a first reflective partition wall 541, a second reflective partition wall 542, and a second light blocking pattern 550. Redundant description of the components of the color conversion panel 500 shown in FIG. 5 that are the same or substantially the same as (or similar to) those of the color conversion panel 300 described above with reference to FIG. 3 may not be repeated.

The second light blocking pattern 550 may partially overlap with the first color conversion pattern 531, the second color conversion pattern 532, and the transmission pattern 533, and may be disposed between the first color conversion pattern 531, the second color conversion pattern 532, and the transmission pattern 533. The second light blocking pattern 550 may be disposed between the substrate 510 and the first color conversion pattern 531, between the substrate 510 and the second color conversion pattern 532, and between the substrate 510 and the transmission pattern 533. For example, a portion of the second light blocking pattern 550 positioned between the first color conversion pattern 531 and the second color conversion pattern 532 may be disposed on the first light blocking pattern 524, and another portion of the second light blocking pattern 550 positioned between the first color conversion pattern 531 (e.g., the adjacent first color conversion pattern 531) and the transmission pattern 533 and between the second color conversion pattern 532 and the transmission pattern 533 may be disposed on the third color filter 523.

The second light blocking pattern 550 may partition areas in which the first color conversion pattern 531, the second color conversion pattern 532, and the transmission pattern 533 are disposed. The second light blocking pattern 550 may block light transmission. The second light blocking pattern 550 may include a material capable of blocking transmission of light, for example, such as an organic material including a colorant such as a black pigment, a black dye, and/or the like, but the material of the second light blocking pattern 550 is not limited thereto. For example, the colorant may include inorganic pigments such as carbon black, titanium black, lignin black, perylene black, cyanine black, and/or the like, complex oxide pigments such as iron/manganese, and/or the like, or a suitable combination thereof.

A width of the second light blocking pattern 550 may be greater than a width of a first area OA1 in which the first color conversion pattern 531 and the second color conversion pattern 532 overlap with each other, a width of a second area OA2 in which the first color conversion pattern 531 (e.g., the adjacent first color conversion pattern 531) and the transmission pattern 533 overlap with each other, and a width of a third area OA3 in which the second color conversion pattern 532 and the transmission pattern 533 overlap with each other. For example, each of the width of the first area OA1, the width of the second area OA2, and the width of the third area OA3 may be about 5 μm to about 20 μm, and the width of the second light blocking pattern 550 may be greater than about 20 μm. As the width of the second light blocking pattern 550 is greater than the width of the first area OA1, the width of the second area OA2, and the width of the third area OA3, the second light blocking pattern 550 may prevent or substantially prevent color mixture defects between the first color conversion patterns 531, the second color conversion patterns 532, and the transmission patterns 533 that are adjacent to each other.

Figure 6:
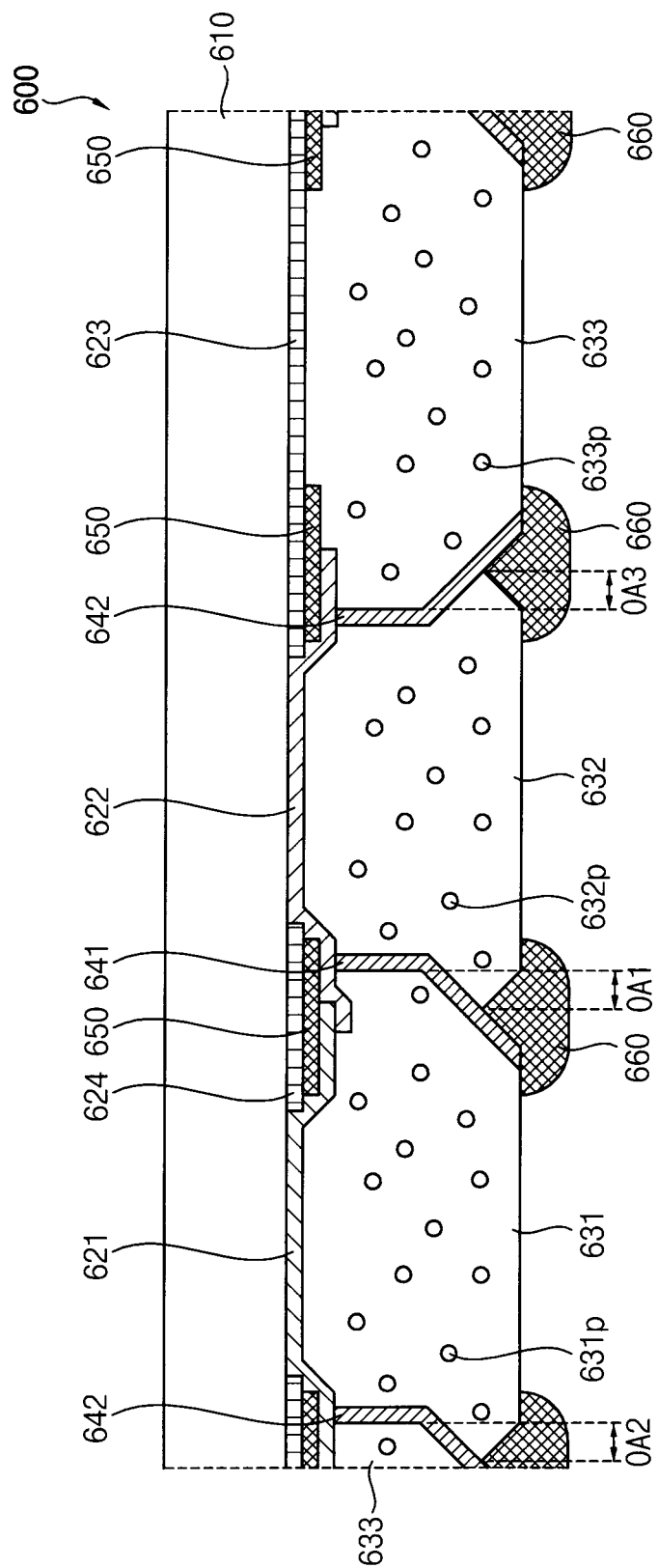
FIG. 6 is a cross-sectional view illustrating a color conversion panel according to an embodiment.

FIG. 6 is a cross-sectional view illustrating a color conversion panel according to an embodiment.

Referring to FIG. 6, a color conversion panel 600 according to an embodiment may include a substrate 610, a first color filter 621, a second color filter 622, a third color filter 623, a first light blocking pattern 624, a first color conversion pattern 631, a second color conversion pattern 632, a transmission pattern 633, a first reflective partition wall 641, a second reflective partition wall 642, a second light blocking pattern 650, and a third light blocking pattern 660. Redundant description of the components of the color conversion panel 600 shown in FIG. 6 that are the same or substantially the same as (or similar to) those of the color conversion panel 500 described above with reference to FIG. 5 may not be repeated.

The third light blocking pattern 660 may partially overlap with the first color conversion pattern 631, the second color conversion pattern 632, and the transmission pattern 633, and may be disposed between the first color conversion pattern 631, the second color conversion pattern 632, and the transmission pattern 633. The third light blocking pattern 660 may be disposed on the first color conversion pattern 631, the second color conversion pattern 632, and the transmission pattern 633. For example, a portion of the third light blocking pattern 660 positioned between the first color conversion pattern 631 and the second color conversion pattern 632 may cover the first reflective partition wall 641 that is not covered (e.g., that is exposed) by the second color conversion pattern 632, and another portion of the third light blocking pattern 660 positioned between the first color conversion pattern 631 (e.g., the adjacent first color conversion pattern 631) and the transmission pattern 633 and between the second color conversion pattern 632 and the transmission pattern 633 may cover the second reflective partition wall 642 that is not covered (e.g., that is exposed) by the first color conversion pattern 631 (e.g., the adjacent first color conversion pattern 631) and the second color conversion pattern 632.

The third light blocking pattern 660 may partition areas in which the first color conversion pattern 631, the second color conversion pattern 632, and the transmission pattern 633 are disposed. The third light blocking pattern 660 may block light transmission. The third light blocking pattern 660 may include a material capable of blocking transmission of light, for example, such as an organic material including a colorant such as a black pigment, a black dye, and/or the like, but the material of the third light blocking pattern 660 is not limited thereto. In an embodiment, the third light blocking pattern 660 may include a material that is the same or substantially the same as the material of the second light blocking pattern 650.

A width of the third light blocking pattern 660 may be greater than a width of the first area OA1 in which the first color conversion pattern 631 and the second color conversion pattern 632 overlap with each other, a width of the second area OA2 in which the first color conversion pattern 631 (e.g., the adjacent first color conversion pattern 631) and the transmission pattern 633 overlap with each other, and a width of the third area OA3 in which the second color conversion pattern 632 and the transmission pattern 633 overlap with each other. For example, each of the width of the first area OA1, the width of the second area OA2, and the width of the third area OA3 may be about 5 μm to about 20 μm, and the width of the third light blocking pattern 660 may be greater than about 20 μm. As the width of the third light blocking pattern 660 is greater than the width of the first area OA1, the width of the second area OA2, and the width of the third area OA3, the third light blocking pattern 660 may prevent or substantially prevent color mixture defects between the first color conversion pattern 631, the second color conversion pattern 632, and the transmission pattern 633 that are adjacent to each other.

FIGS. 7A through 7E are cross-sectional views illustrating a method of manufacturing a color conversion panel according to an embodiment. For example, FIGS. 7A through 7E may illustrate various processes of a method of manufacturing the color conversion panel 600 shown in FIG. 6.

Figure 7A:
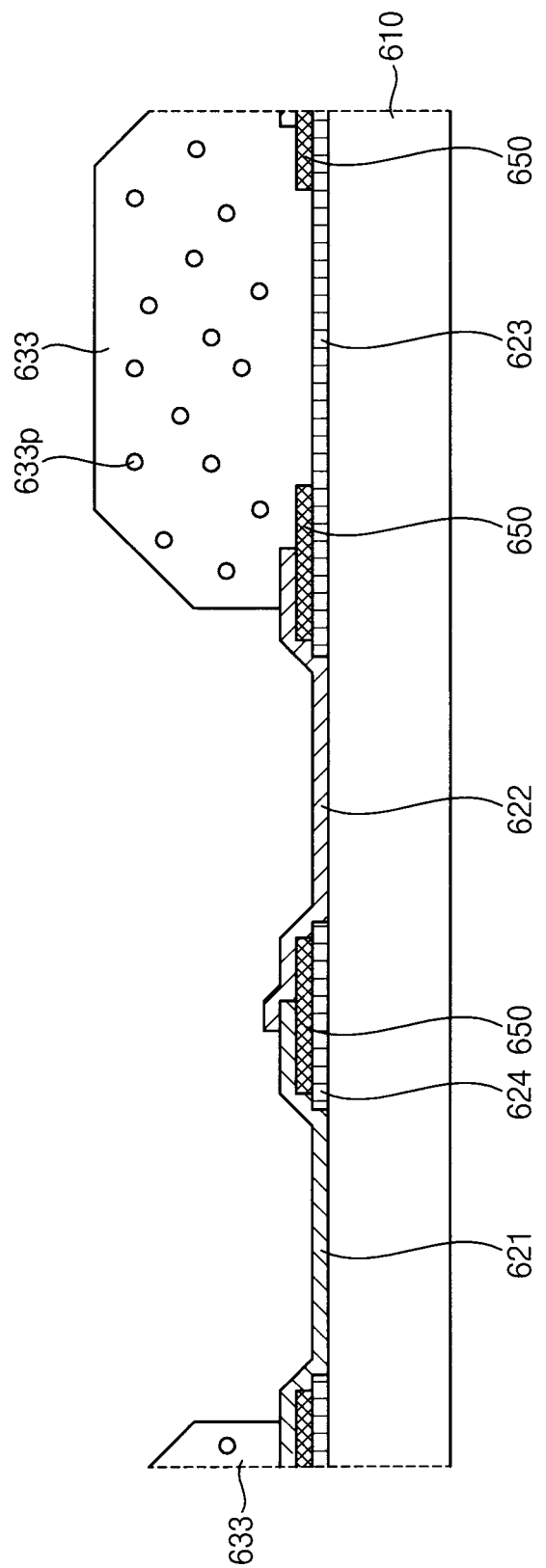
FIGS. 7A-7E are cross-sectional views illustrating a method of manufacturing a color conversion panel according to an embodiment.

Referring to FIG. 7A, the transmission pattern 633 may be formed on the substrate 610.

First, the third color filter 623 and the first light blocking pattern 624 may be formed on the substrate 610 to be spaced apart from each other. The third color filter 623 and the first light blocking pattern 624 may be concurrently (e.g., simultaneously or substantially simultaneously) formed with each other of the same or substantially the same material. Then, the second light blocking pattern 650 may be formed on the third color filter 623 and the first light blocking pattern 624. The first color filter 621 may be formed between the third color filter 623 and the first light blocking pattern 624 on a portion of the substrate 610 that is exposed (e.g., that is not covered by) the third color filter 623. The second color filter 622 may be formed between the third color filter 623 and the first light blocking pattern 624 on a portion of the substrate 610 that is exposed (e.g., that is not covered by) the first color filter 621 and the third color filter 623.

Then, the transmission pattern 633 may be formed on the third color filter 623. For example, the transmission pattern 633 may be formed to partially overlap with the first color filter 621 (e.g., the adjacent first color filter 621) and the second color filter 622. In an embodiment, the transmission pattern 633 may be formed by a photolithography method. For example, a photosensitive resin including the transmissive material 633p may be applied on the substrate 610, and may be patterned to form the transmission pattern 633. In an embodiment, the transmission pattern 633 may be formed by an inkjet method. For example, an ink composition including the transmissive material 633p may be discharged on the third color filter 623, and may be dried and cured to form the transmission pattern 633. However, the method of forming the transmission pattern 633 is not limited to the photolithography method and the inkjet method described above, and the transmission pattern 633 may be formed by various suitable methods, for example, such as a dispensing method, a printing method, a nanoimprinting method, a slit coating method, or the like.

Figure 7B:
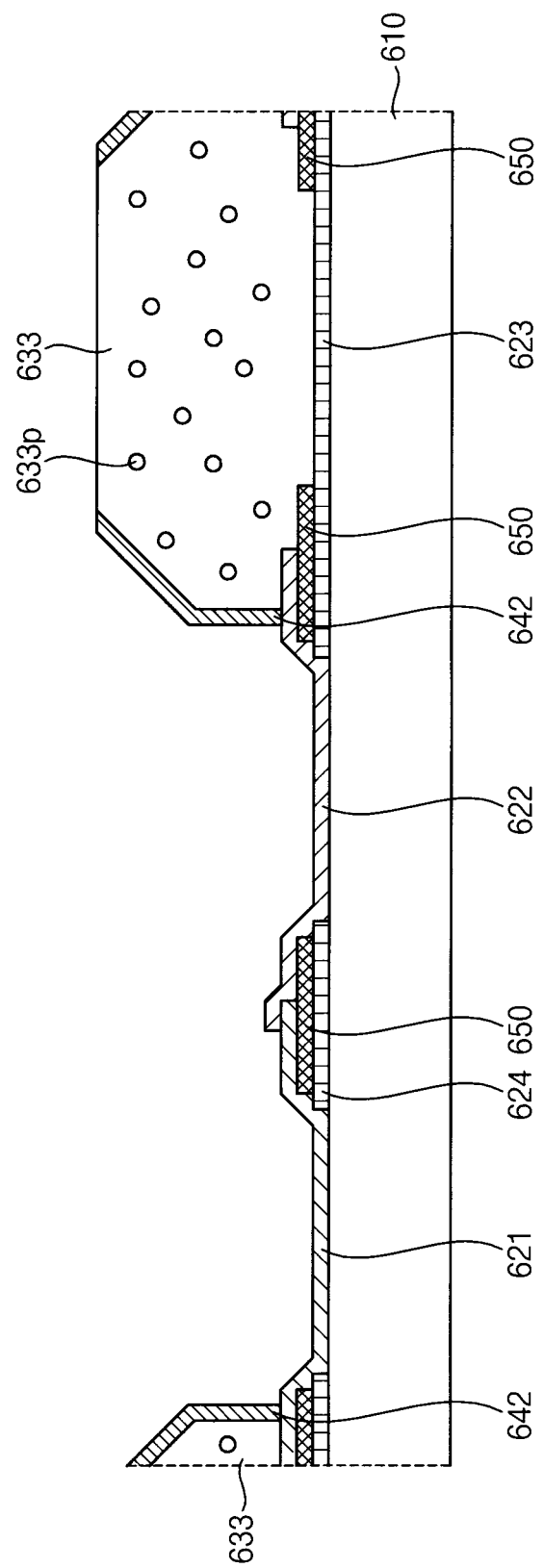

Referring to FIG. 7B, the second reflective partition wall 642 covering the side of the transmission pattern 633 may be formed on the substrate 610 on which the transmission pattern 633 is formed. For example, the second reflective partition wall 642 may be formed on the first color filter 621 (e.g., the adjacent first color filter 621) and the second color filter 622 to cover the side of the transmission pattern 633.

In an embodiment, the second reflective partition wall 642 may be formed by chemical vapor deposition, sputtering, or the like. For example, a conductive material may be deposited on the substrate 610 on which the transmission pattern 633 is formed, and then may be patterned using a photolithography method to form the second reflective partition wall 642. The second reflective partition wall 642 may be formed along a profile of the side of the transmission pattern 633.

Figure 7C:
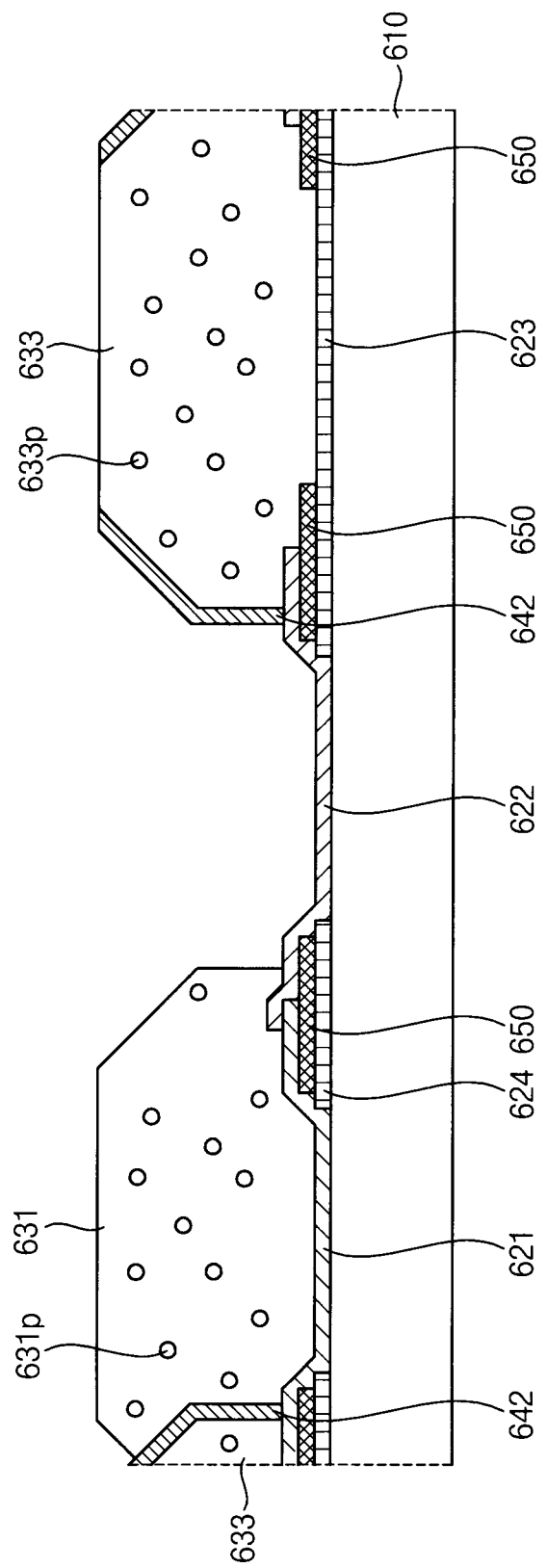

Referring to FIG. 7C, the first color conversion pattern 631 partially overlapping with the transmission pattern 633 (e.g., an adjacent transmission pattern 633) may be formed on the substrate 610 on which the second reflective partition wall 642 is formed. For example, the first color conversion pattern 631 may be formed to partially overlap with the second color filter 622 and the third color filter 623 (e.g., an adjacent third color filter 623).

In an embodiment, the first color conversion pattern 631 may be formed by a photolithography method. For example, a photosensitive resin including the first color conversion material 631p may be applied on the substrate 610 on which the second reflective partition wall 642 is formed, and may be patterned to form the first color conversion pattern 631. In another embodiment, after a photosensitive resin is applied and patterned, the first color conversion material 631p may be injected to form the first color conversion pattern 631. In an embodiment, the first color conversion pattern 631 may be formed by an inkjet method. For example, an ink composition including the first color conversion material 631p may be discharged on the first color filter 621, and may be dried and cured to form the first color conversion pattern 631. However, the method of forming the first color conversion pattern 631 is not limited to the photolithography method and the inkjet method described above, and the first color conversion pattern 631 may be formed by various suitable methods, for example, such as a dispensing method, a printing method, a nanoimprinting method, a slit coating method, or the like.

Figure 7D:
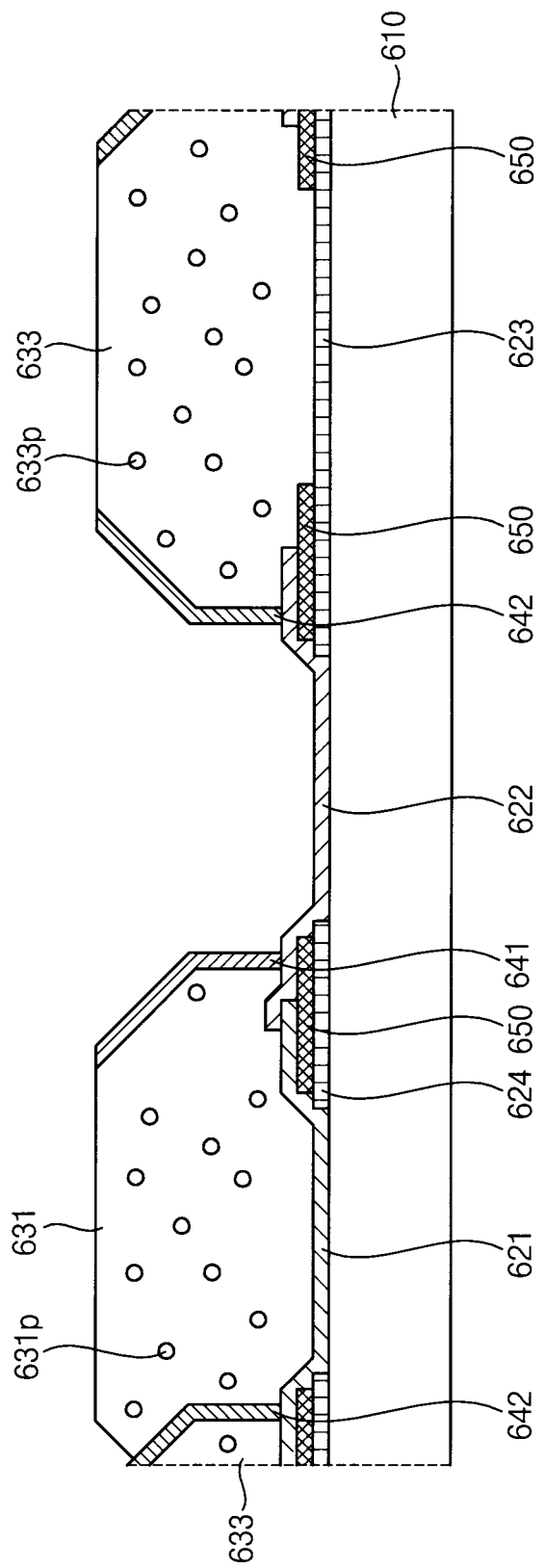

Referring to FIG. 7D, the first reflective partition wall 641 covering the side of the first color conversion pattern 631 may be formed on the substrate 610 on which the first color conversion pattern 631 is formed. For example, the first reflective partition wall 641 may be formed on the second color filter 622 to cover the side of the first color conversion pattern 631.

In an embodiment, the first reflective partition wall 641 may be formed by chemical vapor deposition, sputtering, or the like. For example, a conductive material may be deposited on the substrate 610 on which the first color conversion pattern 631 is formed, and may be patterned using a photolithography method to form the first reflective partition wall 641. The first reflective partition wall 641 may be formed along a profile of the side of the first color conversion pattern 631.

Figure 7E:
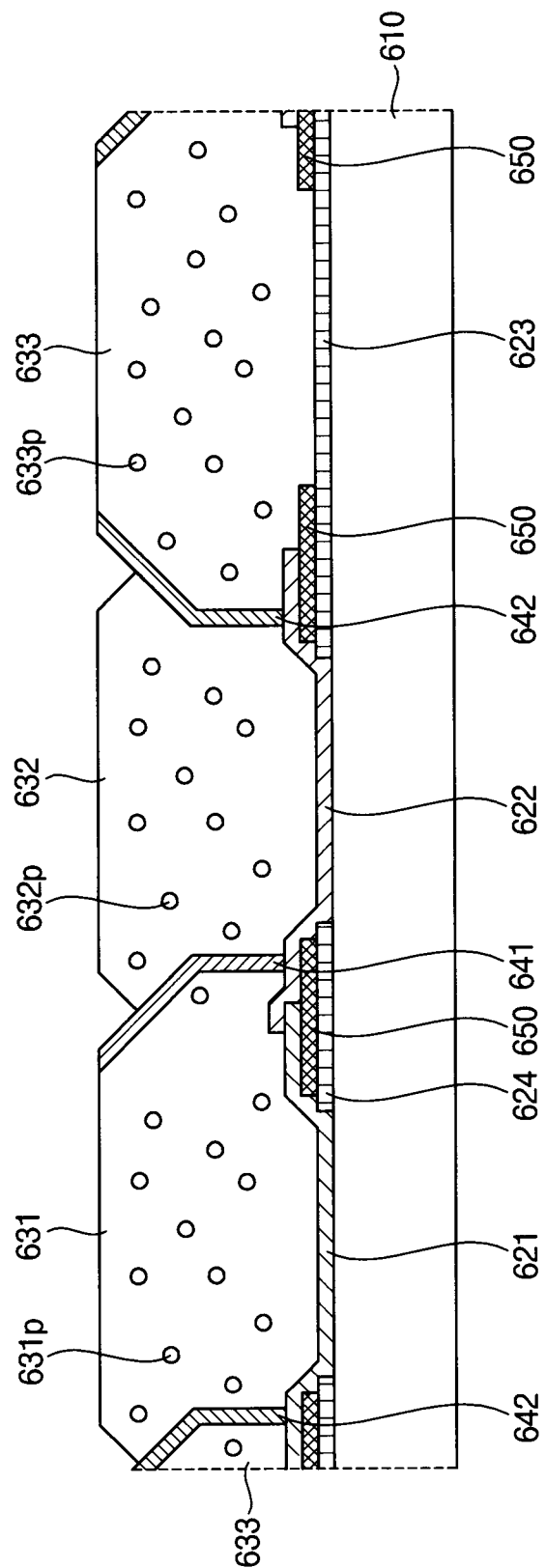

Referring to FIG. 7E, the second color conversion pattern 632 partially overlapping with the transmission pattern 633 and the first color conversion pattern 631 may be formed on the substrate 610 on which the first reflective partition wall 641 is formed.

In an embodiment, the second color conversion pattern 632 may be formed by a photolithography method. For example, a photosensitive resin including the second color conversion material 632p may be applied on the substrate 610 on which the first reflective partition wall 641 is formed, and may be patterned to form the second color conversion pattern 632. In another embodiment, after a photosensitive resin is applied and patterned, the second color conversion material 632p may be injected to form the second color conversion pattern 632. In an embodiment, the second color conversion pattern 632 may be formed by an inkjet method. For example, an ink composition including the second color conversion material 632p may be discharged on the second color filter 622, and may be dried and cured to form the second color conversion pattern 632. However, the method of forming the second color conversion pattern 632 is not limited to the photolithography method and the inkjet method described above, and the second color conversion pattern 632 may be formed by various suitable methods, for example, such as a dispensing method, a printing method, a nanoimprinting method, a slit coating method, or the like.

Referring again to FIG. 6, the third light blocking pattern 660 may be formed on the first color conversion pattern 631, the second color conversion pattern 632, and the transmission pattern 633 between the first color conversion pattern 631, the second color conversion pattern 632, and the transmission pattern 633.

Figure 8:
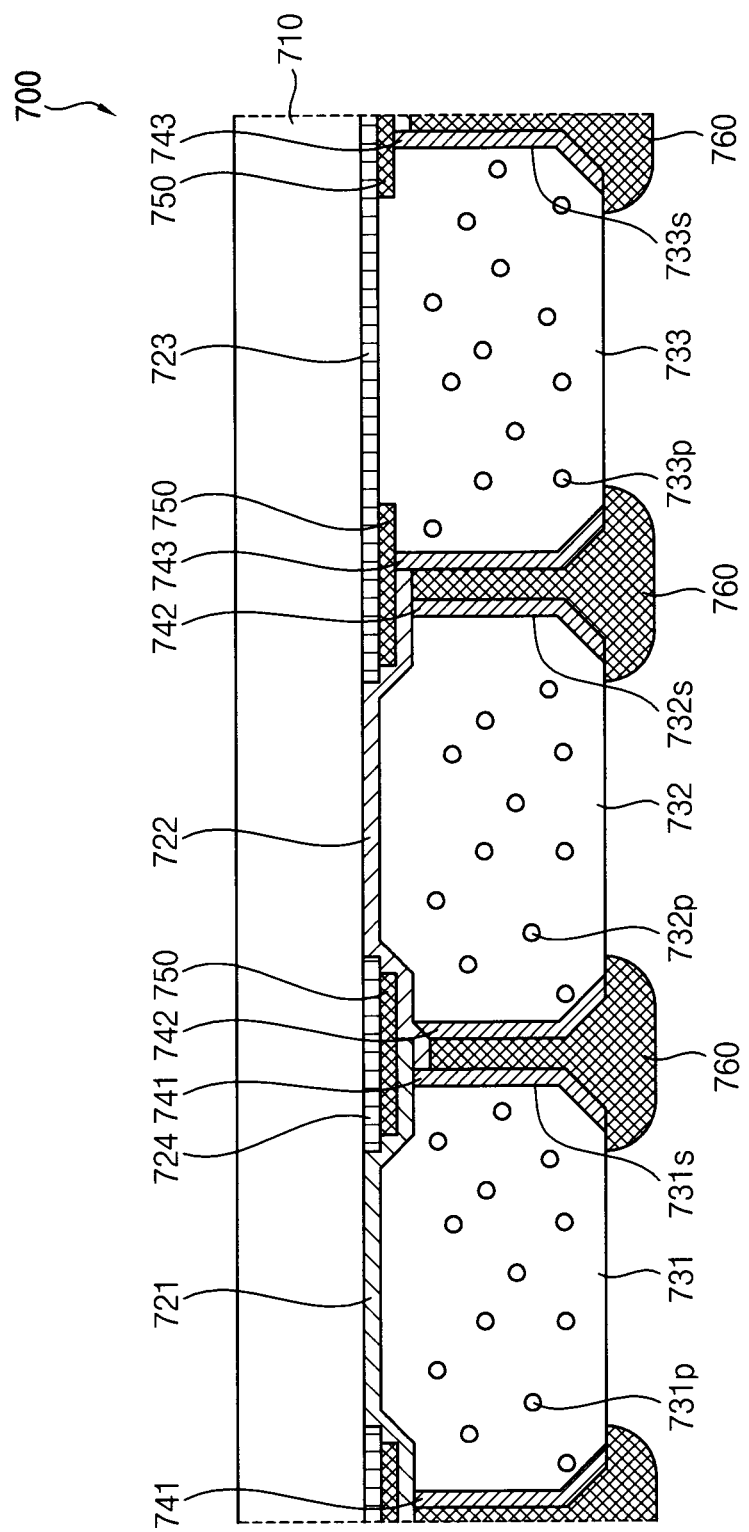
FIG. 8 is a cross-sectional view illustrating a color conversion panel according to an embodiment.

FIG. 8 is a cross-sectional view illustrating a color conversion panel according to an embodiment.

Referring to FIG. 8, a color conversion panel 700 according to an embodiment may include a substrate 710, a first color filter 721, a second color filter 722, a third color filter 723, a first light blocking pattern 724, a first color conversion pattern 731, a second color conversion pattern 732, a transmission pattern 733, a first reflective partition wall 741, a second reflective partition wall 742, a third reflective partition wall 743, a second light blocking pattern 750, and a third light blocking pattern 760. Redundant description of the components of the color conversion panel 700 shown in FIG. 8 that are the same or substantially the same as (or similar to) those of the color conversion panel 600 described above with reference to FIG. 6 may not be repeated.

The second color conversion pattern 732 may be spaced apart from the first color conversion pattern 731. In other words, the second color conversion pattern 732 may not overlap with the first color conversion pattern 731. For example, a width of the first color conversion pattern 731 may be less than a width of the first color filter 721, and a width of the second color conversion pattern 732 may be less than a width of the second color filter 722.

The transmission pattern 733 may be spaced apart from the first color conversion pattern 731 (e.g., the adjacent first color conversion pattern 731) and the second color conversion pattern 732. In other words, the transmission pattern 733 may not overlap with the first color conversion pattern 731 (e.g., the adjacent first color conversion pattern 731) and the second color conversion pattern 732. For example, a width of the transmission pattern 733 may be less than a width of the third color filter 723.

The first reflective partition wall 741 may be disposed on a side 731s of the first color conversion pattern 731 to cover the side 731s of the first color conversion pattern 731. For example, the first reflective partition wall 741 may be disposed on the first color filter 721 while covering the side 731s of the first color conversion pattern 731. The first reflective partition wall 741 may reflect light emitted to the side 731s of the first color conversion pattern 731, and may emit the light toward the substrate 710. Accordingly, light emission efficiency of the first color conversion pattern 731 may be increased.

In an embodiment, the first reflective partition wall 741 may entirely cover the side 731s of the first color conversion pattern 731. The first reflective partition wall 741 may be formed along a profile of the side 731s of the first color conversion pattern 731. A height of the first reflective partition wall 741 from the substrate 710 may be equal to or substantially equal to a height of the first color conversion pattern 731 from the substrate 710. The height of the first color conversion pattern 731 may be a distance from the substrate 710 to a lower surface of the first color conversion pattern 731, and the height of the first reflective partition wall 741 may be a distance from the substrate 710 to a lower surface of the first reflective partition wall 741.

The second reflective partition wall 742 may be disposed on a side 732s of the second color conversion pattern 732 to cover the side 732s of the second color conversion pattern 732. For example, the second reflective partition wall 742 may be disposed on the second color filter 722 while covering the side 732s of the second color conversion pattern 732. The second reflective partition wall 742 may reflect light emitted to the side 732s of the second color conversion pattern 732, and may emit the light toward the substrate 710. Accordingly, light emission efficiency of the second color conversion pattern 732 may be increased.

In an embodiment, the second reflective partition wall 742 may entirely cover the side 732s of the second color conversion pattern 732. The second reflective partition wall 742 may be formed along a profile of the side 732s of the second color conversion pattern 732. A height of the second reflective partition wall 742 from the substrate 710 may be equal to or substantially equal to a height of the second color conversion pattern 732 from the substrate 710. The height of the second color conversion pattern 732 may be a distance from the substrate 710 to a lower surface of the second color conversion pattern 732, and the height of the second reflective partition wall 742 may be a distance from the substrate 710 to a lower surface of the second reflective partition wall 742.

In an embodiment, the second reflective partition wall 742 may be spaced apart from the first reflective partition wall 741. In other words, a gap may be formed between the first reflective partition wall 741 and the second reflective partition wall 742.

The third reflective partition wall 743 may be disposed on a side 733s of the transmission pattern 733 to cover the side 733s of the transmission pattern 733. For example, the third reflective partition wall 743 may be disposed on the second light blocking pattern 750 while covering the side 733s of the transmission pattern 733. The third reflective partition wall 743 may reflect light emitted to the side 733s of the transmission pattern 733, and may emit the light toward the substrate 710. Accordingly, light emission efficiency of the transmission pattern 733 may be increased.

In an embodiment, the third reflective partition wall 743 may entirely cover the side 733s of the transmission pattern 733. The third reflective partition wall 743 may be formed along a profile of the side 733s of the transmission pattern 733. A height of the third reflective partition wall 743 from the substrate 710 may be equal to or substantially equal to a height of the transmission pattern 733 from the substrate 710. The height of the transmission pattern 733 may be a distance from the substrate 710 to a lower surface of the transmission pattern 733, and the height of the third reflective partition wall 743 may be a distance from the substrate 710 to a lower surface of the third reflective partition wall 743.

In an embodiment, the third reflective partition wall 743 may be spaced apart from the first reflective partition wall 741 (e.g., the adjacent first reflective partition wall 741) and the second reflective partition wall 742. In other words, gaps may be formed between the first reflective partition wall 741 (e.g., the adjacent first reflective partition wall 741) and the third reflective partition wall 743 and between the second reflective partition wall 742 and the third reflective partition wall 743, respectively.

The third light blocking pattern 760 partially overlapping with the first color conversion pattern 731, the second color conversion pattern 732, and the transmission pattern 733 may be disposed between the first color conversion pattern 731, the second color conversion pattern 732, and the transmission pattern 733. The third light blocking pattern 760 may be disposed on the first color conversion pattern 731, the second color conversion pattern 732, and the transmission pattern 733, while covering the first reflective partition wall 741, the second reflective partition wall 742, and the third reflective partition wall 743. In an embodiment, the third light blocking pattern 760 may fill the gaps formed between the first reflective partition wall 741, the second reflective partition wall 742, and the third reflective partition wall 743 that are spaced apart from each other.

FIGS. 9A through 9D are cross-sectional views illustrating a method of manufacturing a color conversion panel according to an embodiment. For example, FIGS. 9A through 9D may illustrate various processes of a method of manufacturing the color conversion panel 700 shown in FIG. 8.

Redundant description of the components and processes of the method of manufacturing the color conversion panel 700 shown in FIGS. 9A through 9D that are the same or substantially the same as (or similar to) those of the method of manufacturing the color conversion panel 600 described above with reference to FIGS. 7A through 7E may not be repeated.

Figure 9A:
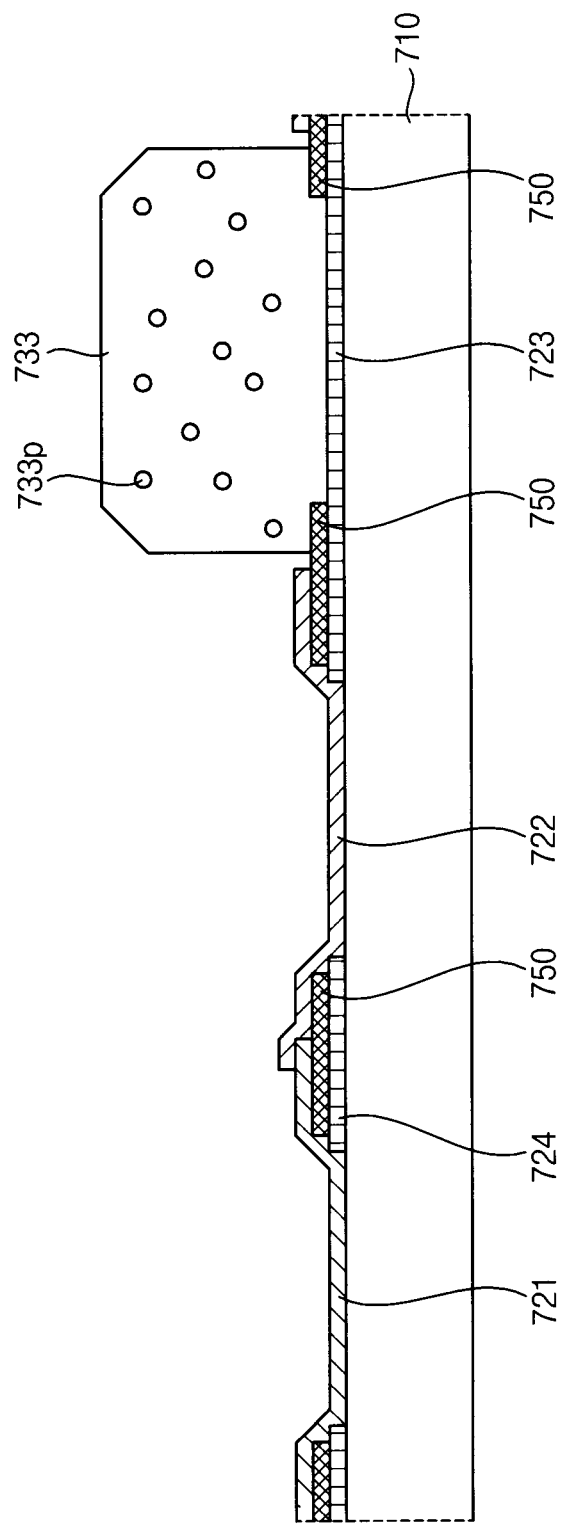
FIGS. 9A-9D are cross-sectional views illustrating a method of manufacturing a color conversion panel according to an embodiment.

Referring to FIG. 9A, the transmission pattern 733 may be formed on the substrate 710. The transmission pattern 733 may be formed on the third color filter 723. For example, the transmission pattern 733 may be formed so as not to overlap with the first color filter 721 (e.g., the adjacent first color filter 721) and the second color filter 722.

Figure 9B:
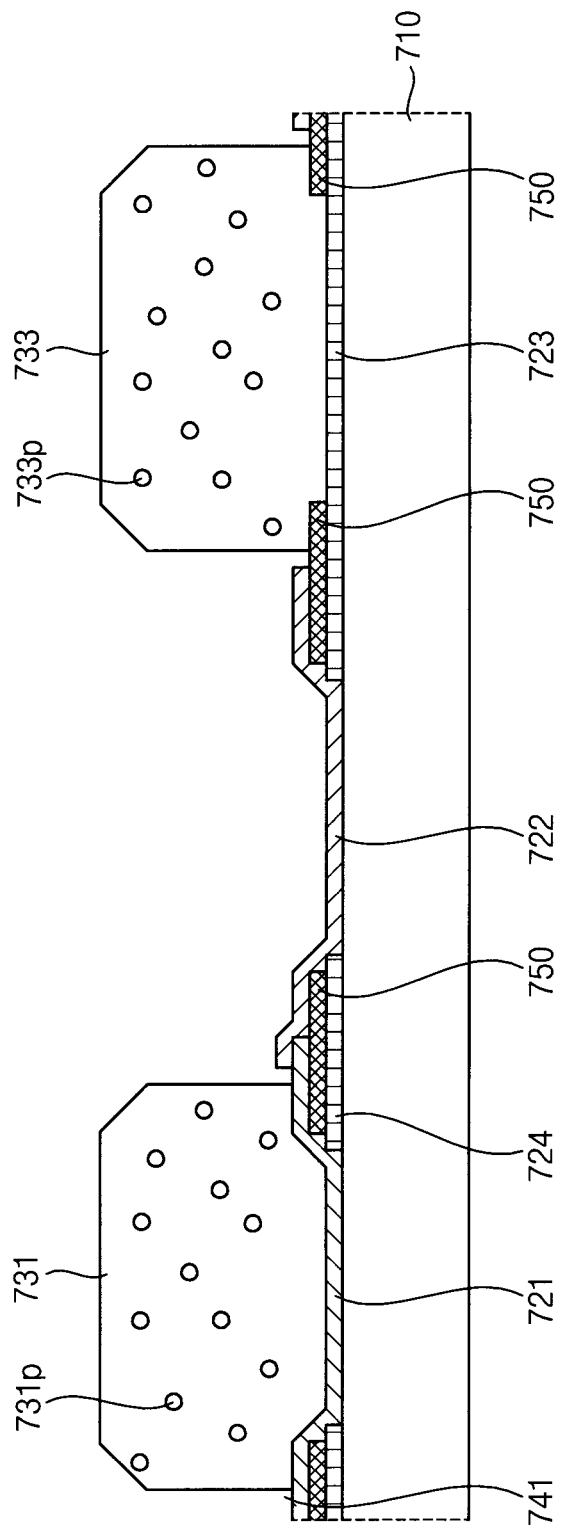

Referring to FIG. 9B, the first color conversion pattern 731 may be formed on the substrate 710 on which the transmission pattern 733 is formed to be spaced apart from the transmission pattern 733. The first color conversion pattern 731 may be formed on the first color filter 721. For example, the first color conversion pattern 731 may be formed so as not to overlap with the second color filter 722 and the third color filter 723.

Figure 9C:
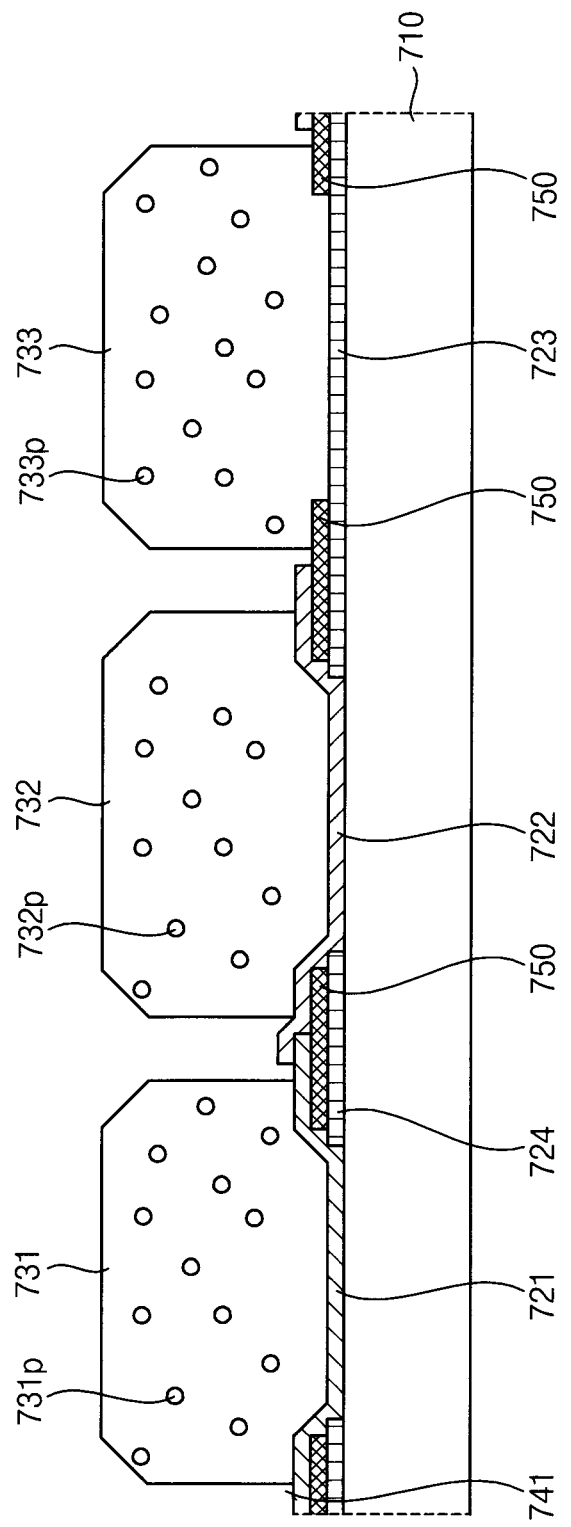

Referring to FIG. 9C, the second color conversion pattern 732 may be formed on the substrate 710 on which the transmission pattern 733 and the first color conversion pattern 731 are formed to be spaced apart from the transmission pattern 733 and the first color conversion pattern 731. The second color conversion pattern 732 may be formed on the second color filter 722. For example, the second color conversion pattern 732 may be formed so as not to overlap with the first color filter 721.

In the method of manufacturing the color conversion pattern 700 described above, the first color conversion pattern 731 is formed after the formation of the transmission pattern 733, and the second color conversion pattern 732 is formed after the formation of the first color conversion pattern 731, but the method of manufacturing the color conversion pattern 700 is not limited thereto. For example, the first color conversion pattern 731, the second color conversion pattern 732, and the transmission pattern 733 may be sequentially formed in an arbitrary order, or may be concurrently (e.g., simultaneously or substantially simultaneously) formed with each other.

Figure 9D:
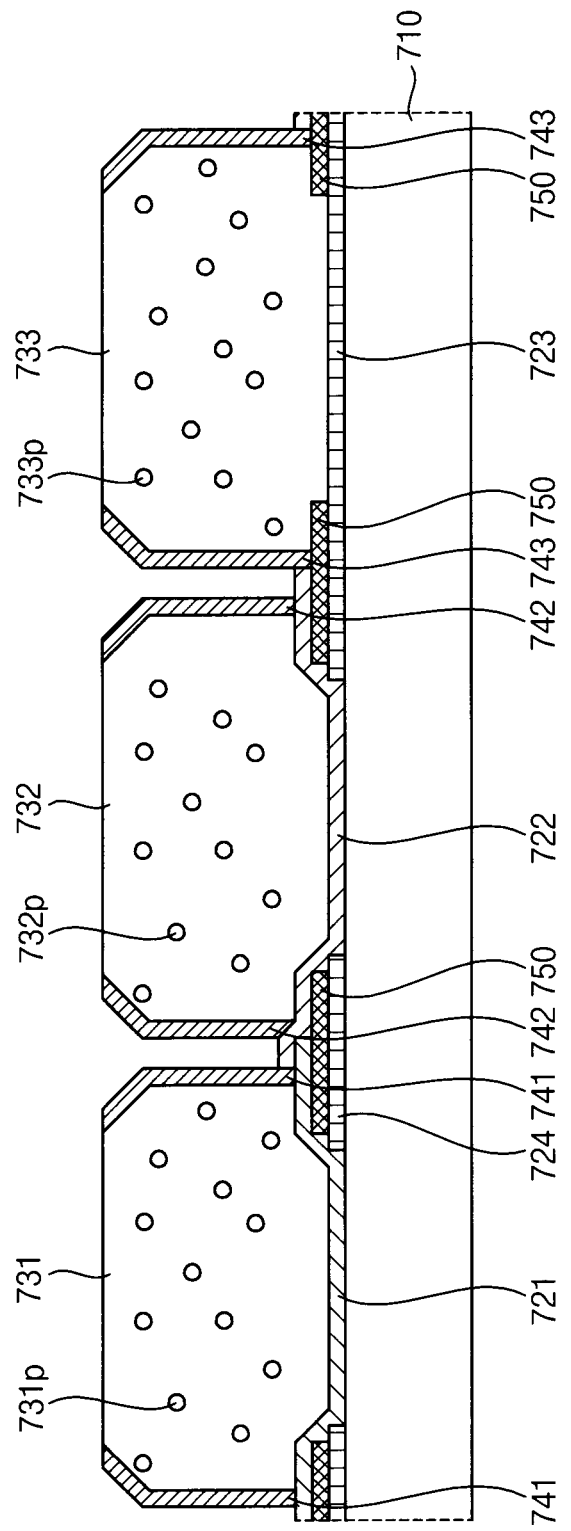

Referring to FIG. 9D, the first reflective partition wall 741 covering the side of the first color conversion pattern 731, the second reflective partition wall 742 covering the side of the second color conversion pattern 732, and the third reflective partition wall 743 covering the side of the transmission pattern 733 may be formed on the substrate 710 on which the transmission pattern 733, the first color conversion pattern 731, and the second color conversion pattern 732 are formed. For example, the first reflective partition wall 741 may be formed on the first color filter 721 to cover the side of the first color conversion pattern 731, the second reflective partition wall 742 may be formed on the second color filter 722 to cover the side of the second color conversion pattern 732, and the third reflective partition wall 743 may be formed on the third color filter 723 to cover the side of the transmission pattern 733.

In an embodiment, the first reflective partition wall 741, the second reflective partition wall 742, and the third reflective partition wall 743 may be concurrently (e.g., simultaneously or substantially simultaneously) formed with each other of the same or substantially the same material. For example, a conductive material may be deposited on the substrate 710 on which the transmission pattern 733, the first color conversion pattern 731, and the second color conversion pattern 732 are formed, and may be patterned using a photolithography method and/or the like to form the first reflective partition wall 741, the second reflective partition wall 742, and the third reflective partition wall 743. The first reflective partition wall 741, the second reflective partition wall 742, and the third reflective partition wall 743 may be formed along a profile of the side of the first color conversion pattern 731, a profile of the side of the second color conversion pattern 732, and a profile of the side of the transmission pattern 733, respectively. Accordingly, manufacturing costs and manufacturing time for forming the first reflective partition wall 741, the second reflective partition wall 742, and the third reflective partition wall 743 may be reduced.

Subsequently, the third light blocking pattern 760 partially overlapping with the first color conversion pattern 731, the second color conversion pattern 732, and the transmission pattern 733 may be disposed between the first color conversion pattern 731, the second color conversion pattern 732, and the transmission pattern 733 to fill the gaps between the first reflective partition wall 741, the second reflective partition wall 742, and the third reflective partition wall 743 as described above with reference to FIG. 8.

Figure 10:
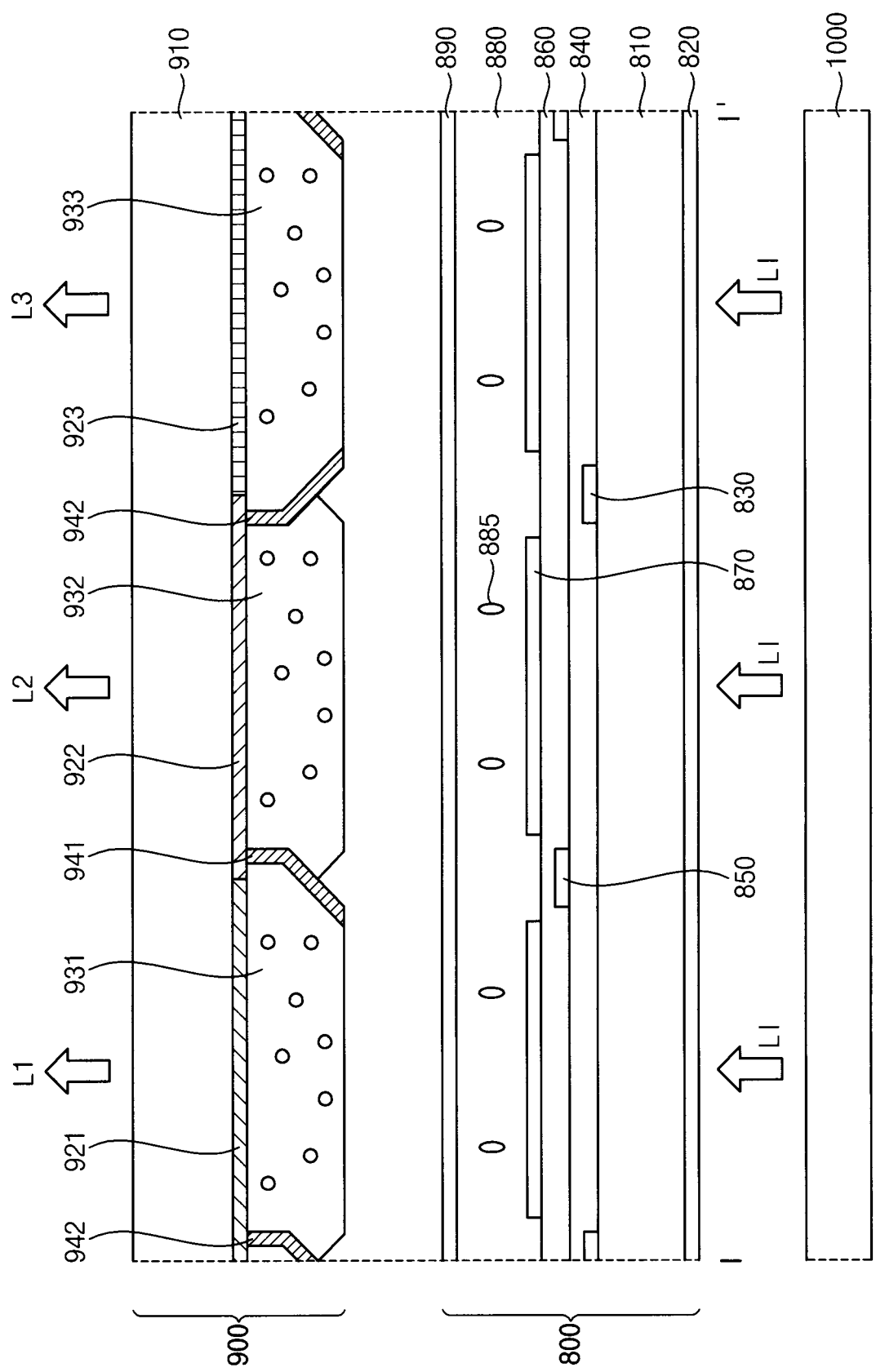
FIG. 10 is a cross-sectional view illustrating an example of the display device taken along the line I-I' in FIG. 1.

FIG. 10 is a cross-sectional view illustrating an example of the display device taken along the line I-I' in FIG. 1.

Referring to FIGS. 1 and 10, a display device according to an embodiment may include a display panel 800, a color conversion panel 900, and a backlight unit (e.g., a backlight or a backlight panel) 1000.

The backlight unit 1000 may overlap with the display panel 800. The backlight unit 1000 may be positioned under (e.g., underneath) the display panel 800. The backlight unit 1000 may include a light source for generating light, and a light guide plate for receiving the light and for guiding the light toward the display panel 800. The backlight unit 1000 may provide incident light LI to the display panel 800. In an embodiment, the backlight unit 1000 may provide the incident light LI of a third color having a peak wavelength within a range of about 430 nm to about 470 nm to the display panel 800.

The display panel 800 may include a base substrate 810, a polarizing layer 820, a gate line 830, a gate insulation layer 840, a data line 850, a passivation layer 860, a first electrode 870, a liquid crystal layer 880, and a second electrode 890. The display panel 800 may control the incident light LI provided from the backlight unit 1000, and may provide the incident light LI to the color conversion panel 900.

The polarizing layer 820 may be disposed between the backlight unit 1000 and the base substrate 810. The polarizing layer 820 may be a coated polarizing layer, a wire grid polarizer, or the like.

A gate electrode and the gate line 830 may be disposed on the base substrate 810. The gate line 830 may transmit a gate signal, and may extend along one direction. The gate insulation layer 840 including silicon nitride, silicon oxide, or the like may be disposed on the gate electrode and the gate line 830.

A semiconductor layer, a source electrode, a drain electrode, and the data line 850 may be disposed on the gate insulation layer 840. The semiconductor layer may overlap with the gate electrode, the source electrode and the drain electrode may be connected to the semiconductor layer, and the data line 850 may transmit a data signal and extend in a direction crossing the gate line 830. The gate electrode, the semiconductor layer, the source electrode, and the drain electrode may form a thin film transistor. The passivation layer 860 including an inorganic insulation material, for example, such as silicon nitride or silicon oxide, and/or an organic insulation material, for example, such as polyimide, may be disposed on the semiconductor layer, the source electrode, the drain electrode, and the data line 850.

The first electrode 870 including a conductive material may be disposed on the passivation layer 860. The first electrode 870 may be connected to the source electrode or the drain electrode. The second electrode 890 including a conductive material may be disposed on the first electrode 870.

The liquid crystal layer 880 may be disposed between the first electrode 870 and the second electrode 890. The liquid crystal layer 880 may include liquid crystal molecules 885. An arrangement direction of the liquid crystal molecules 885 may be controlled by an electric field formed between the first electrode 870 and the second electrode 890. The liquid crystal layer 880 may control the transmittance of the incident light LI of the third color provided from the backlight unit 1000 based on the electric field formed between the first electrode 870 and the second electrode 890, and may emit the incident light LI upward (or in a direction toward the color conversion panel 900).

The color conversion panel 900 may overlap with the display panel 800. The color conversion panel 900 may be positioned above the display panel 800. The color conversion panel 900 may include a substrate 910, a first color filter 921, a second color filter 922, a third color filter 923, a first color conversion pattern 931, a second color conversion pattern 932, a transmission pattern 933, a first reflective partition wall 941, and a second reflective partition wall 942. The color conversion panel 900 may receive the incident light LI provided from the backlight unit 1000 and controlled by the display panel 800, and may emit first light L1, second light L2, and third light L3 upward (or in a direction away from the display panel 800). However, the present disclosure is not limited thereto, and in various embodiments, the color conversion panel 900 may have a structure that is the same or substantially the same as (or similar to) any of the embodiments of the color conversion panels described above.

The display device according to one or more embodiments of the present disclosure may be applied to a display device included in a computer, a notebook, a mobile phone, a smartphone, a smart pad, a PMP, a PDA, an MP3 player, or the like.

Although some embodiments have been described, those skilled in the art will readily appreciate that various modifications are possible in the embodiments without departing from the spirit and scope of the present disclosure. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

DESCRIPTION OF THE REFERENCE SYMBOLS 100, 800: display panel
200, 300, 400, 500, 600, 700, 900: color conversion panel
210, 310, 410, 510, 610, 710, 910: substrate
221, 321, 421, 521, 621, 721, 921: first color filter
222, 322, 422, 522, 622, 722, 922: second color filter
324, 424, 524, 624, 724: first light blocking pattern
231, 331, 431, 531, 631, 731, 931: first color conversion pattern
232, 332, 432, 532, 632, 732, 932: second color conversion pattern
233, 333, 433, 533, 633, 733, 933: transmission pattern
241, 341, 441, 541, 641, 741, 941: first reflective partition wall
242, 342, 442, 542, 642, 742, 942: second reflective partition wall
743: third reflective partition wall
550, 650, 750: second light blocking pattern
660, 760: third light blocking pattern

The invention claimed is:

1. A display device, comprising:
a display panel; and
a color conversion panel overlapping with the display panel, the color conversion panel comprising:
a substrate;
a first color conversion pattern on the substrate;
a second color conversion pattern on the substrate, and partially overlapping with the first color conversion pattern;
a transmission pattern on the substrate, and partially overlapping with a portion of the first color conversion pattern that is adjacent thereto and the second color conversion pattern;

a first reflective partition wall between the first color conversion pattern and the second color conversion pattern;

a first color filter between the substrate and the first color conversion pattern; and a second color filter between the substrate and the second color conversion pattern.

2. The display device of claim 1, wherein the first reflective partition wall covers a side of the first color conversion pattern.

3. The display device of claim 2, wherein the second color conversion pattern does not contact the first color conversion pattern.

4. The display device of claim 1, wherein the second color conversion pattern contacts the first color conversion pattern underneath the first reflective partition wall.

5. The display device of claim 1, wherein the color conversion panel further comprises:

a light blocking pattern partially overlapping with the first color conversion pattern and the second color conversion pattern between the first color conversion pattern and the second color conversion pattern.

6. The display device of claim 5, wherein the light blocking pattern is located between the substrate and the first color conversion pattern, and between the substrate and the second color conversion pattern.

7. The display device of claim 5, wherein the light blocking pattern is located on the first color conversion pattern and the second color conversion pattern.

8. The display device of claim 5, wherein a width of the light blocking pattern is greater than a width of an area in which the first color conversion pattern overlaps with the second color conversion pattern.

9. The display device of claim 1, wherein the color conversion panel further comprises:

a second reflective partition wall between the portion of the first color conversion pattern and the transmission pattern, and between the second color conversion pattern and the transmission pattern.

10. The display device of claim 9, wherein the second reflective partition wall covers a side of the transmission pattern.

11. The display device of claim 10, wherein the transmission pattern does not contact the portion of the first color conversion pattern and the second color conversion pattern.

12. The display device of claim 9, wherein the transmission pattern contacts the portion of the first color conversion pattern and the second color conversion pattern underneath the second reflective partition wall.

13. The display device of claim 1, wherein the display panel is configured to emit a first color light to the color conversion panel, wherein the first color conversion pattern is configured to convert the first color light into a second color light, wherein the second color conversion pattern is configured to convert the first color light into a third color light, and wherein the transmission pattern is configured to transmit the first color light.

14. The display device of claim 1, wherein each of the first color conversion pattern and the second color conversion pattern comprises at least one of a quantum dot and a phosphor.

15. A color conversion panel, comprising:

a substrate;

a first color conversion pattern on the substrate, and configured to convert an incident light into a first color light;

a second color conversion pattern on the substrate, and configured to convert the incident light into a second color light, the second color conversion pattern partially overlapping with the first color conversion pattern;

a transmission pattern on the substrate, and configured to transmit the incident light, the transmission pattern partially overlapping with a portion of the first color conversion pattern that is adjacent thereto;

a first reflective partition wall between the first color conversion pattern and the second color conversion pattern;

a first color filter between the substrate and the first color conversion pattern, and configured to block the incident light that is not converted by the first color conversion pattern; and a second color filter between the substrate and the second color conversion pattern, and configured to block the incident light that is not converted by the second color conversion pattern.

16. The color conversion panel of claim 15, further comprising:

a second reflective partition wall between the portion of the first color conversion pattern and the transmission pattern.

17. The color conversion panel of claim 15, further comprising:

a light blocking pattern partially overlapping with the first color conversion pattern and the second color conversion pattern between the first color conversion pattern and the second color conversion pattern, and partially overlapping with the portion of the first color conversion pattern and the transmission pattern between the portion of the first color conversion pattern and the transmission pattern.

18. The color conversion panel of claim 17, wherein the light blocking pattern is located between the substrate and the first color conversion pattern, between the substrate and the second color conversion pattern, and between the substrate and the transmission pattern.

19. The color conversion panel of claim 17, wherein the light blocking pattern is located on the first color conversion pattern, the second color conversion pattern, and the transmission pattern.

20. A color conversion panel, comprising:

a substrate;

a first color conversion pattern on the substrate, and configured to convert an incident light into a first color light;

a second color conversion pattern on the substrate, and configured to convert the incident light into a second color light, the second color conversion pattern being spaced apart from and not overlapping with the first color conversion pattern;

a first reflective partition wall covering opposite sides of the first color conversion pattern;

a second reflective partition wall covering opposite sides of the second color conversion pattern;

a first color filter between the substrate and the first color conversion pattern, and configured to block the incident light that is not converted by the first color conversion pattern; and a second color filter between the substrate and the second color conversion pattern, and configured to block the incident light that is not converted by the second color conversion pattern.

21. The color conversion panel of claim 20, further comprising:
a transmission pattern on the substrate, and configured to transmit the incident light, the transmission pattern being spaced apart from the first color conversion pattern and the second color conversion pattern.

22. The color conversion panel of claim 21, further comprising:
a third reflective partition wall covering opposite sides of the transmission pattern.

23. The color conversion panel of claim 22, further comprising:
a light blocking pattern partially overlapping with the first color conversion pattern and the second color conversion pattern between the first color conversion pattern and the second color conversion pattern, partially overlapping with a portion of the first color conversion pattern that is adjacent to the transmission pattern and the transmission pattern between the portion of the first color conversion pattern and the transmission pattern, and partially overlapping with the second color conversion pattern and the transmission pattern between the second color conversion pattern and the transmission pattern.

24. The color conversion panel of claim 23, wherein the light blocking pattern covers the first reflective partition wall, the second reflective partition wall, and the third reflective partition wall.

25. The color conversion panel of claim 20, wherein the second reflective partition wall is spaced apart from the first reflective partition wall.

* * * * *